(12) United States Patent
Lu et al.

(10) Patent No.: US 11,985,805 B2
(45) Date of Patent: May 14, 2024

(54) THERMALLY CONDUCTIVE ELECTROMAGNETICALLY ABSORPTIVE MATERIAL

(71) Applicant: 3M INNOVATIVE PROPERTIES COMPANY, St. Paul, MN (US)

(72) Inventors: Zhonghua Lu, Woodbury, MN (US); Badri Veeraraghavan, Woodbury, MN (US); Joel S. Peiffer, Maplewood, MN (US); Jeffrey A. Tostenrude, Leander, TX (US); Jaewon Kim, Woodbury, MN (US); Zulfiqar A. Khan, Woodbury, MN (US); Jennifer J. Sokol, Mahtomedi, MN (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 0 days.

(21) Appl. No.: 17/910,543

(22) PCT Filed: Mar. 23, 2021

(86) PCT No.: PCT/IB2021/052413
§ 371 (c)(1),
(2) Date: Sep. 9, 2022

(87) PCT Pub. No.: WO2021/198849
PCT Pub. Date: Oct. 7, 2021

(65) Prior Publication Data
US 2023/0119856 A1  Apr. 20, 2023

Related U.S. Application Data

(60) Provisional application No. 63/002,399, filed on Mar. 31, 2020.

(51) Int. Cl.
*H01Q 1/52* (2006.01)
*H01Q 1/02* (2006.01)
*H05K 9/00* (2006.01)

(52) U.S. Cl.
CPC .............. *H05K 9/0083* (2013.01); *H01Q 1/02* (2013.01); *H01Q 1/526* (2013.01)

(58) Field of Classification Search
CPC ........ C08K 2201/003; C08K 2201/005; C08K 2201/014; C09K 5/08; C09K 5/14
See application file for complete search history.

(56) References Cited

U.S. PATENT DOCUMENTS

2008/0012103 A1    1/2008  Foster et al.
2016/0234981 A1*   8/2016  Do ....................... H05K 9/0083
(Continued)

FOREIGN PATENT DOCUMENTS

CN    103627271 A    3/2014
CN    105542469 A    5/2016
(Continued)

OTHER PUBLICATIONS

Huber Engineered Materials, Martoxid (RTM) TM-1250 Technical Data Sheet, 2016. (Year: 2016).*
(Continued)

*Primary Examiner* — Monique R Jackson
(74) *Attorney, Agent, or Firm* — Clifton F. Richardson

(57) ABSTRACT

A thermally conductive electromagnetically absorbing material includes a plurality of particles dispersed in a binder. The plurality of particles can have a particle size distribution having at least three peaks, where at least a majority of particles within a half width at half maximum of one, but not the other ones, of the at least three peaks are at least partially coated with an electromagnetically absorbing coating. The plurality of particles can include pluralities of first and
(Continued)

second particles where a total number of the first particles is at most 1% of a total number of the first and second particles and where the first particles are more electromagnetically absorbing than the second particles. Films, molded articles and systems including the thermally conductive electromagnetically absorbing material are described.

6 Claims, 23 Drawing Sheets

(56) References Cited

U.S. PATENT DOCUMENTS

| | | | |
|---|---|---|---|
| 2018/0090992 A1* | 3/2018 | Shrivastava | H02J 50/20 |
| 2021/0135378 A1* | 5/2021 | Cho | H01Q 21/28 |
| 2021/0167487 A1* | 6/2021 | Varma | H01Q 21/28 |
| 2022/0002606 A1* | 1/2022 | Ganapatibhotla | C08K 5/1515 |

FOREIGN PATENT DOCUMENTS

| | | |
|---|---|---|
| CN | 107690270 A | 2/2018 |
| JP | 2002-164689 | 6/2002 |
| JP | 2010186856 A | 8/2010 |
| JP | 2013-042026 | 2/2013 |
| JP | 2014-239236 | 2/2014 |

OTHER PUBLICATIONS

Yang, Silicon carbide powders: Temperature-dependent dielectric properties and enhanced microwave absorption at gigahertz range, 2013, Solid State Communications, vol. 163, pp. 1-6. (Year: 2013).*

Di Marco, Dielectric properties of pure alumina from 8 GHz to 73 GHZ, 2016, Journal of the European Ceramic Society, vol. 36, pp. 3355-3361. (Year: 2016).*

Wang, Complex permittivity and permeability of carbonyl iron powders at microwave frequencies, 2003, IEEE Antennas and Propagation Society International Symposium. Digest. Held in conjunction with: USNC/CNC/URSI North American Radio Sci. Meeting (Cat. No. 03CH37450), Columbus OH, vol. 4, pp. 619-622. (Year: 2003).*

Zhou, Influence of Cr content on structure and magnetic properties of Fe—Si—Al—Cr powders, 2010, Journal of Magnetism and Magnetic Materials, vol. 322, pp. 2589-2592. (Year: 2010).*

Fang et al., Physical and Chemical Basis and Experimental Design of Chemical Plating, Metallurgical Industry Press, 1st edition, Jan. 2011, pp. 199-200.

International Search Report for PCT International Application No. PCT/IB2021/052413, dated Jun. 15, 2021, 3 pages.

* cited by examiner

THERMALLY CONDUCTIVE ELECTROMAGNETICALLY ABSORPTIVE MATERIAL

CROSS REFERENCE TO RELATED APPLICATIONS

This application is a national stage filing under 35 U.S.C. 371 of PCT/IB2021/052413, filed Mar. 23, 2021, which claims the benefit of Provisional Application No. 63/002,399, filed Mar. 31, 2020, the disclosure of which are incorporated by reference in their entirety herein.

BACKGROUND

Electromagnetically absorbing material can include electromagnetically absorptive particles in a binder.

Thermally conductive material can include thermally conductive particles in a binder.

SUMMARY

The present disclosure relates generally to material that is both thermally conductive and electromagnetically absorptive. The material can include a plurality of thermally conductive electromagnetically absorptive first particles and thermally conductive substantially electromagnetically non-absorptive second particles where a total number of the first particles is at most 1% of a total number of all the particles.

In some aspects of the present disclosure, a thermally conductive electromagnetically absorbing material including a plurality of particles dispersed in a binder is provided. The plurality of particles has a particle size distribution having at least three peaks. At least a majority of particles within a half width at half maximum (HWHM) of one, but not the other ones, of the at least three peaks are at least partially coated with an electromagnetically absorbing coating.

In some aspects of the present disclosure, a thermally conductive electromagnetically absorbing material is provided. The material includes a plurality of first particles dispersed in a binder and having a first Dv50 size a1 and a plurality of second particles dispersed in the binder and having a second Dv50 size a2, where a1/a2≥1.5. The first particles include at most 1% of a total number of the first and second particles and are more electromagnetically absorbing than the second particles, such that the material has a thermal conductivity of at least 2 W/(m-K) along at least one direction, and for an at least one frequency in a frequency range from about 20 GHz to about 120 GHz, the material: has a relative real permittivity of less than about 10; and attenuates a substantially normally incident radiation having the at least one frequency by at least 5 dB/mm.

In some aspects of the present disclosure, a thermally conductive electromagnetically absorbing material including a plurality of thermally conductive particles dispersed in a binder at a volume loading of at least about 50 percent is provided. The particles have a particle size distribution having peaks at particle sizes d1, d2 and d3, where d1>d2>d3. At least a majority of particles within a half width at half maximum (HWHM) of the peak corresponding to the particles size d1, but not d2 and d3, are at least partially coated with an electromagnetically absorbing coating.

Films, injection moldable pellets, molded articles and systems including the thermally conductive electromagnetically absorbing material are provided.

These and other aspects will be apparent from the following detailed description. In no event, however, should this brief summary be construed to limit the claimable subject matter.

DETAILED DESCRIPTION

Figure 1:
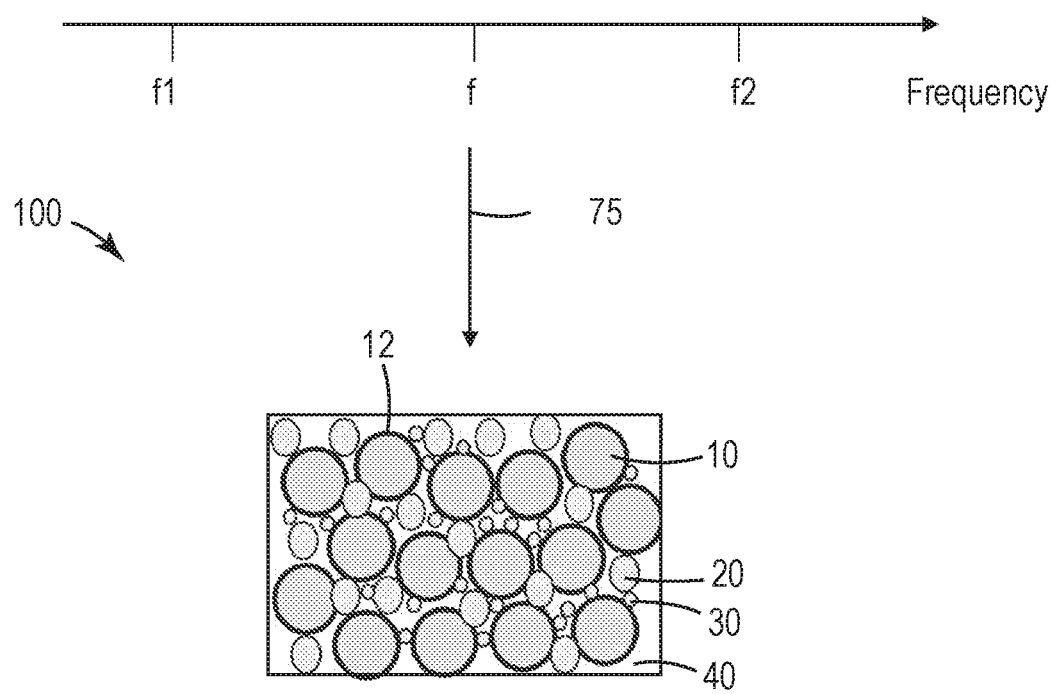
FIG. 1 is a schematic illustration of an illustrative thermally conductive electromagnetically absorbing material.

In the following description, reference is made to the accompanying drawings that form a part hereof and in which various embodiments are shown by way of illustration. The drawings are not necessarily to scale. It is to be understood that other embodiments are contemplated and may be made without departing from the scope or spirit of the present description. The following detailed description, therefore, is not to be taken in a limiting sense.

Material that that is both thermally conductive and electromagnetically absorptive is provided. Thermally conductive electromagnetically absorptive particles can be provided by coating a thin layer of metal (e.g., tungsten) on thermally conductive non-electrically conductive particles. Such particles can be dispersed in a binder to provide an electromagnetically absorptive material. However, it is difficult to achieve a high thermal conductivity with monodispersed or approximately monodispersed particles. A multimodal distribution of the particles with a high volume loading (e.g., a volume loading of at least about 50% or at least about 60%) can be used to increase the thermal conductivity of the material. However, it has been found that when a multimodal distribution of the thermally conductive electromagnetically absorptive particles with a high loading is used to increase the thermal conductivity, the electromagnetic absorption is reduced. Without intending to be limited by theory, it is believed that this is due, at least in part, to an increased reflectance which results in less electromagnetic energy propagating into the material that can be absorbed. However, it has been found that when only a fraction (e.g., less than 1% of the total number of particles) of the thermally conductive particles includes an electromagnetically absorptive coating, a high thermal conductivity (e.g., at least about 2 W/(m-K)) and a high electromagnetic absorptivity (e.g., at least about 5 dB/mm in a predetermined frequency range) can be achieved. By including the electromagnetically absorptive coating on only a fraction of the particles, the real part of the relative permittivity can be reduced compared to the case where all or even a majority of the particles are coated. This reduced relative real permittivity can result in reduced surface reflections from the thermally conductive electromagnetically absorptive material.

A thermally conductive material is a material having a thermal conductivity of at least about 1 W/(m-K) along at least one direction. In some embodiments, a thermally conductive material has a thermal conductivity of at least bout 1.5 W/(m-K), or at least about 2 W/(m-K), or at least about 2.5 W/(m-K), or at least about 3 W/(m-K) along at least one direction. The thermal conductivity can be in a range of about 2 W/(m-K) or about 2.5 W/(m-K) to about 7 W/(m-K) or about 5 W/(m-K), for example, along the at least one direction. Thermally conductive particles can have a thermal conductivity of at least 2 W/(m-K), or at least 5 W/(m-K), or at least 10 W/(m-K), or at least 20 W/(m-K), or at least 30 W/(m-K) (e.g., along at least one direction). In some cases, the thermal conductivity of the particles is at least 2 W/(m-K), or at least 5 W/(m-K), or at least 10 W/(m-K), or at least 20 W/(m-K), or at least 30 W/(m-K) along at least two orthogonal directions (e.g., in the plane of a thermally conductive plate or flake, or along each of three mutually orthogonal directions in a particle extending in each of the three directions (e.g., a substantially spherical particle)). Thermal conductivity can be determined according to the ASTM D5470-17 test standard, for example.

FIG. 1 is a schematic illustration of an illustrative thermally conductive electromagnetically absorbing material 100. The material 100 includes pluralities of first particles 10, second particles 20, and third particles 30 dispersed in a binder 40. The first particles 10 are generally larger than the second particles 20 which are generally larger than the third particles 30. The first particles 10, but not the second and third particles 20 and 30, are coated with an electromagnetically absorbing coating 12. There are typically many more second and third particles 20 and 30 than first particles 10. In some embodiments, the total number of first particles 10 is at most 1% of a total number of the first, second and third particles 10, 20 and 30. It has been found that including the electromagnetically absorbing coating 12 only on the larger first particles 10 provides improved absorption compared to also including the electromagnetically absorbing coating 12 on the second and/or third particles.

The particles included in the thermally conductive electromagnetically absorbing material can have a multimodal particle size distribution. In the embodiment illustrated in FIG. 1, the particles (first, second and third particles 10, 20 and 30) have a trimodal particle size distribution. In some embodiments, an additional fourth particle is included (e.g., having a size generally smaller than the third particles 30) so that the particles have a quadrimodal particle size distribution. In some such embodiments, still other additional particles are included. In other embodiments, one of the second or third particles is omitted so that the particles have a bimodal particle size distribution.

FIG. 1 also schematically illustrates a substantially normally incident (e.g., within 20 degrees, or within 10 degrees, or within 5 degrees of normal) electromagnetic wave 75 having a frequency f in a frequency range from f1 to f2. The frequency range f1 to f2 can be selected based on the intended application of the material 100. For example, for fifth generation (5G) wireless communication systems, f1 can be about 20 GHz and f2 can be about 120 GHz or about 40 GHz. As another example, for automotive radar applications, f1 can be about 76 GHz and f2 can be about 81 GHz. The electromagnetic wave 75 can have a beam diameter small compared to a size or radius of curvature of the material 100 so that the beam can be locally substantially normally incident on a portion of a surface of the material 100. In some embodiments, the thermally conductive electromagnetically absorbing material 100 has an electromagnetic absorptivity of at least 5 dB/mm for a substantially normally incident electromagnetic wave 75 having at least one frequency f in a frequency range from about 20 GHz to about 120 GHz or from about 76 GHz to about 81 GHz. The electromagnetic absorptivity can be at least 5.5 dB/mm, or at least 6 dB/mm, or in a range of about 5 to about 10 dB/mm, for example. The electromagnetic absorptivity can be determined from scattering parameters measured in a waveguide experiment, for example (e.g., the complex permittivity can be determined from the measured S11 and S21 parameters and then used to determine the electromagnetic absorptivity). The scattering parameters are determined for radiation substantially normally incident on the material in air, unless indicated differently.

Figures 2A, 2B:
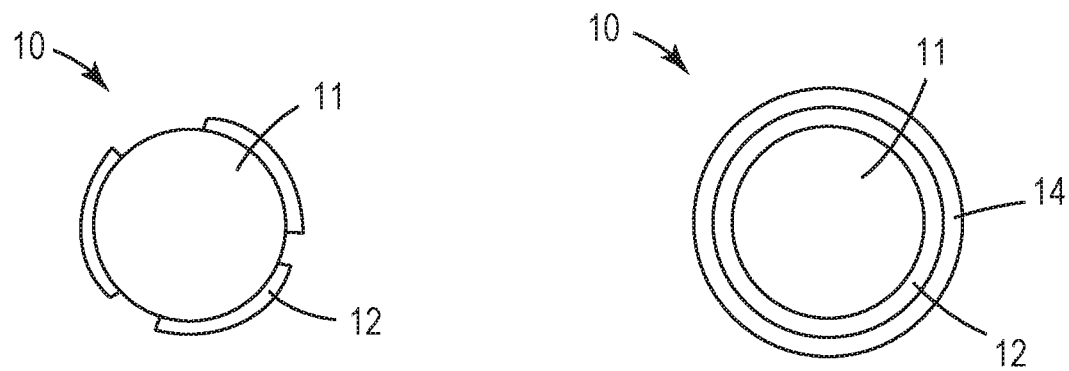
FIGS. 2A-2B are a schematic cross-sectional views of illustrative particles.

FIGS. 2A-2B are a schematic cross-sectional views of illustrative particles 10. In the embodiments, of FIGS. 2A-2B, the particle 10 includes a core 11 at least partially coated with an electromagnetically absorbing coating 12. In the embodiment of FIG. 2A, the particle 10 is only partially coated with the electromagnetically absorbing coating 12. The partial coating can include a plurality of islands of the coating material and can, in some embodiments, include varying densities of the coating material in the islands. In the embodiment of FIG. 2B, the particle 10 is fully coated with the electromagnetically absorbing coating 12. In the embodiment of FIG. 2B, the particle 10 is further at least partially coated with a material 14, which may also be included in the embodiment of FIG. 2A. While the coating layers 12 and 14 in FIG. 2B are schematically shown as continuous, the coating(s) can, in some embodiments, be only partial layers leaving portions of the underlying material exposed. In some embodiments, the coating 12 is discontinuous (e.g., as illustrated in FIG. 2A) and the coating 14 is continuous or substantially continuous. In some embodiments, the layer 12 can have an average thickness of about 0.1 nm to about 100 nm, or about 0.5 nm to about 50 nm, or about 1 nm to about 20 nm, for example. In some embodiments, the layer 14 can have an average thickness in a range of about 1 nm to about 100 nm, or about 1 nm to about 20 nm, for example. The layers 12 and 14 can be applied by physical vapor deposition (e.g., magnetron sputtering), for example, as generally described in U.S. Pat. Nos. 4,612,242 (Vesley et al.); 5,389,434 (Chamberlain et al.); 7,727,931 (Brey et al.); and 8,698,394 (McCutcheon et al.), for example.

The coating 12 can be said to be electromagnetically absorptive if the coating 12 contributes substantially to the electromagnetic absorptivity of the material 100 including the particles 10 (e.g., in some embodiments, replacing the particles 10 with otherwise equivalent particles not having the coating 12 would reduce the electromagnetic absorptivity of the material 100 by at least 20%, or at least 40%, or at least 60%). Particles included in the material 100 which do not contribute substantially to the electromagnetic absorptivity of the material 100 can be referred to as substantially electromagnetically non-absorptive particles. In some embodiments, most of the electromagnetic absorptivity of the material 100 arises due to the presence of the coated particles 10.

Thermally conductive particles can be electrically insulative and/or can include an electrically insulative core (e.g., an electrical resistivity of at least 100 $\Omega$m). In some embodiments, the core and/or the uncoated particles (e.g., 20, 30) has an electrical resistivity of greater than 100 $\Omega$m, or greater than 200 $\Omega$m, or greater than 500 $\Omega$m, or greater than 1000 $\Omega$m. In some embodiments, the core 11 is thermally conductive and electrically insulative. In some such embodiments or in other embodiments, the electromagnetically absorbing coating 12 is electrically conductive (e.g., an electrical resistivity of no more than 200 $\mu\Omega$cm) and/or includes or is formed from an electrically conductive material (e.g., electrically conductive material forming discontinuous islands). In some such embodiments or in other embodiments, the material 14 is electrically insulative (e.g., an electrical resistivity of at least 100 $\Omega$m or in any of the ranges described for the core 11). The electrical resistivity can be determined at low frequencies (e.g., about 1 kHz or less) or statically (direct current).

The particles (e.g., 10, 20, and/or 30) can have any suitable shape (e.g., at least one of flakes, plates, spheres, spheroids, ellipsoids, irregularly shaped particles). In some embodiments, at least a majority of the particles are substantially spherical. A particle can be considered substantially spherical if its outline fits within the intervening space between two, concentric, truly spherical outlines differing in diameter from one another by up to about 30% of the diameter of the larger of these outlines. In some embodiments, each particle in at least a majority of the particles fits within the intervening space between two, concentric, truly spherical outlines differing in diameter from one another by up to about 20% or 10% of the diameter of the larger of these outlines.

Particle size distributions can be characterized in terms of number distributions or volume distributions, for example. Volume distributions are often useful when a substantially smaller number of substantially larger particles and a substantially larger number of substantially smaller particles are present. A cumulative particle size distribution function V(S) can be defined such that V(S) is the fraction (or percent) of the total volume of the particles provided by particles having a size no more than S, where the particle size is the particle diameter or equivalent diameter (diameter of a sphere having the same volume as the particle). A particle size distribution function can be defined on a linear or log scale, for example. A log scale is often useful when particles having substantially different sizes are present. A particle size distribution f(S) can be defined as being proportional to dV(S)/dLog(S) so that an area under a plot of f(S) versus Log(S) between Log(S1) and Log(S2) is proportional to the fraction (or percent) of the total volume of the particles provided by particles having sizes between S1 and S2. The distribution function distribution f(S) is normalized so that the cumulative distribution function V(S) approaches 1 or 100% for large particle size. f(S) can be determined from laser light scattering techniques, for example, as is known in the art. A number distribution n(S) for the particle size can similarly be defined so that an area under a plot of n(S) versus Log(S) between Log(S1) and Log(S2) is proportional to the fraction (or percent) of the total number of the particles provided by particles having sizes between S1 and S2. The particle size distributions described herein can be understood to be volume distributions and plots of the particle size distribution can be understood to be linear-log plots (the distribution function values on a linear y-axis and the particle size on a logarithmic x-axis), unless indicated otherwise.

Figure 3A:
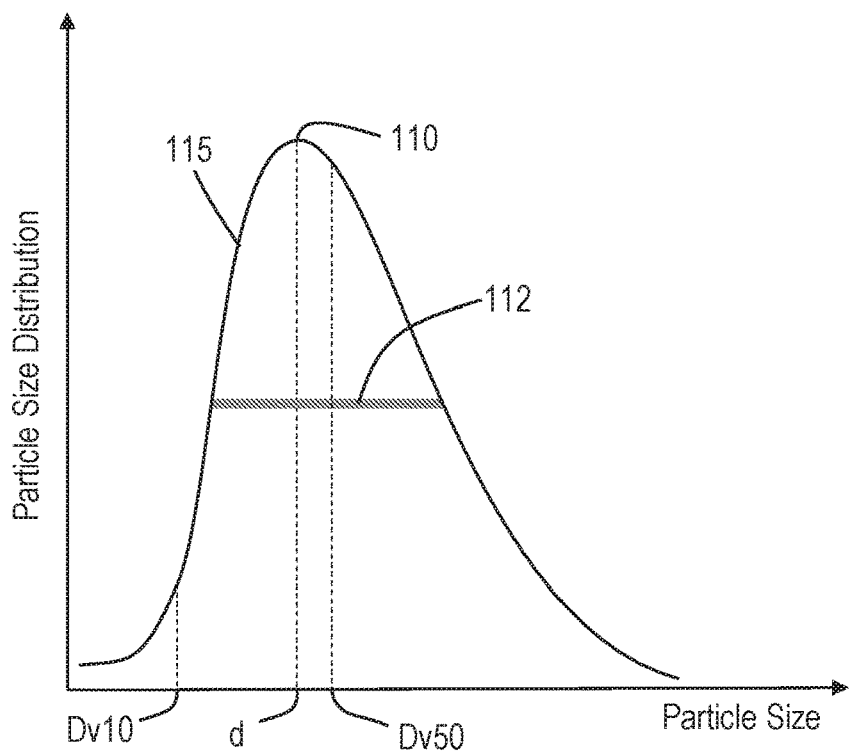
FIGS. 3A-3B are schematic plots of an illustrative particle size distribution.
Figure 3B:
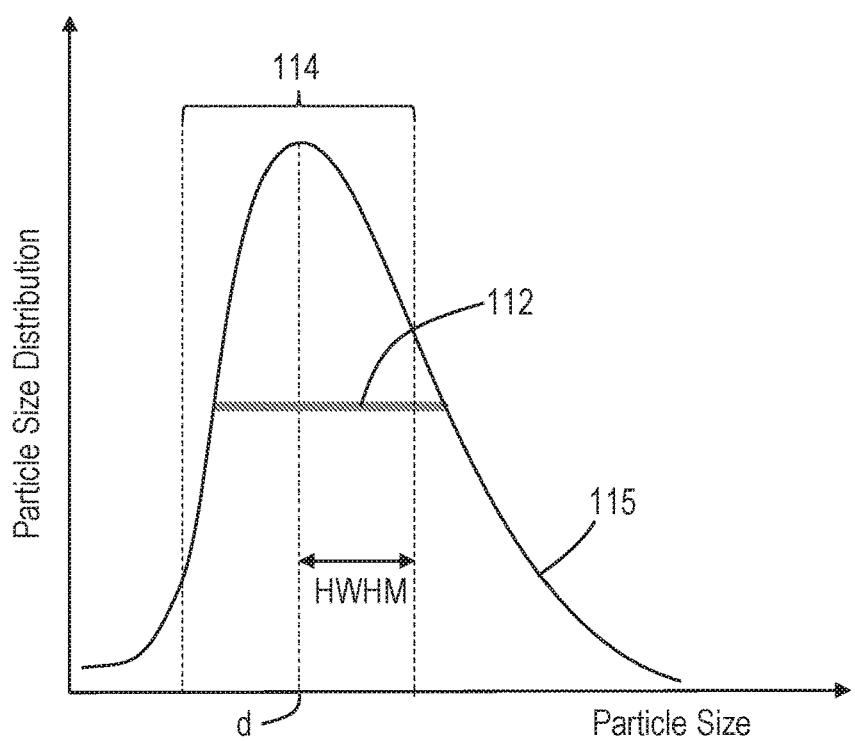

FIGS. 3A-3B are schematic plots of an illustrative particle size distribution 115. The particle size distribution of any of the first, second and third particles 10, 20 and 30 can appear generally as depicted in FIG. 3. The particle size distribution of the others of the first, second and third particles 10, 20 and 30 can also appear generally as depicted in FIG. 3 but shifted to different ranges of particle sizes. The particle size distribution 115 has a peak 110 at a particle size d and has a full width at half maximum 112. Half of the full width at half maximum 112 is the half width at half maximum (HWHM). A particle size range 114 within a half width at half maximum (HWHM) of the peak 110 (the range d±HWHM) is indicated in FIG. 3B. The particle size distribution can be characterized by DvX values where X is the percent of the total volume of the particles provided by particles having a size no more than the DvX value. For example, particles having a size of Dv10 or less provide 10% of the total volume of the particles. Similarly, particles having a size of Dv50 or less provide 50% of the total volume of the particles. The Dv50 value may be about the same as the particle size d of the peak 110 or may be greater than or less than the size d depending on the shape of the distribution.

Figure 4A:
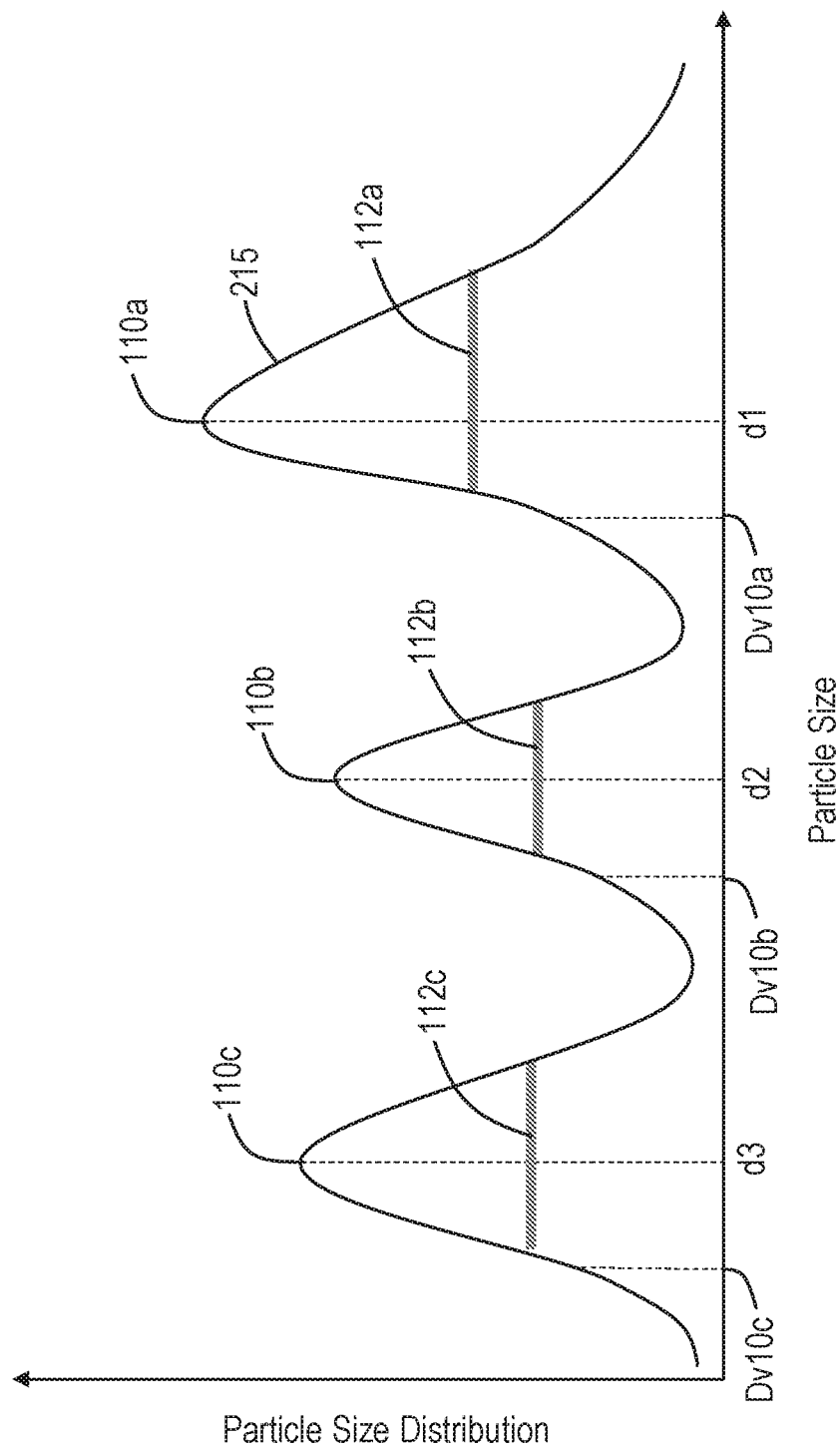
FIGS. 4A-4B are schematic plots of an illustrative trimodal particle size distribution.
Figure 4B:
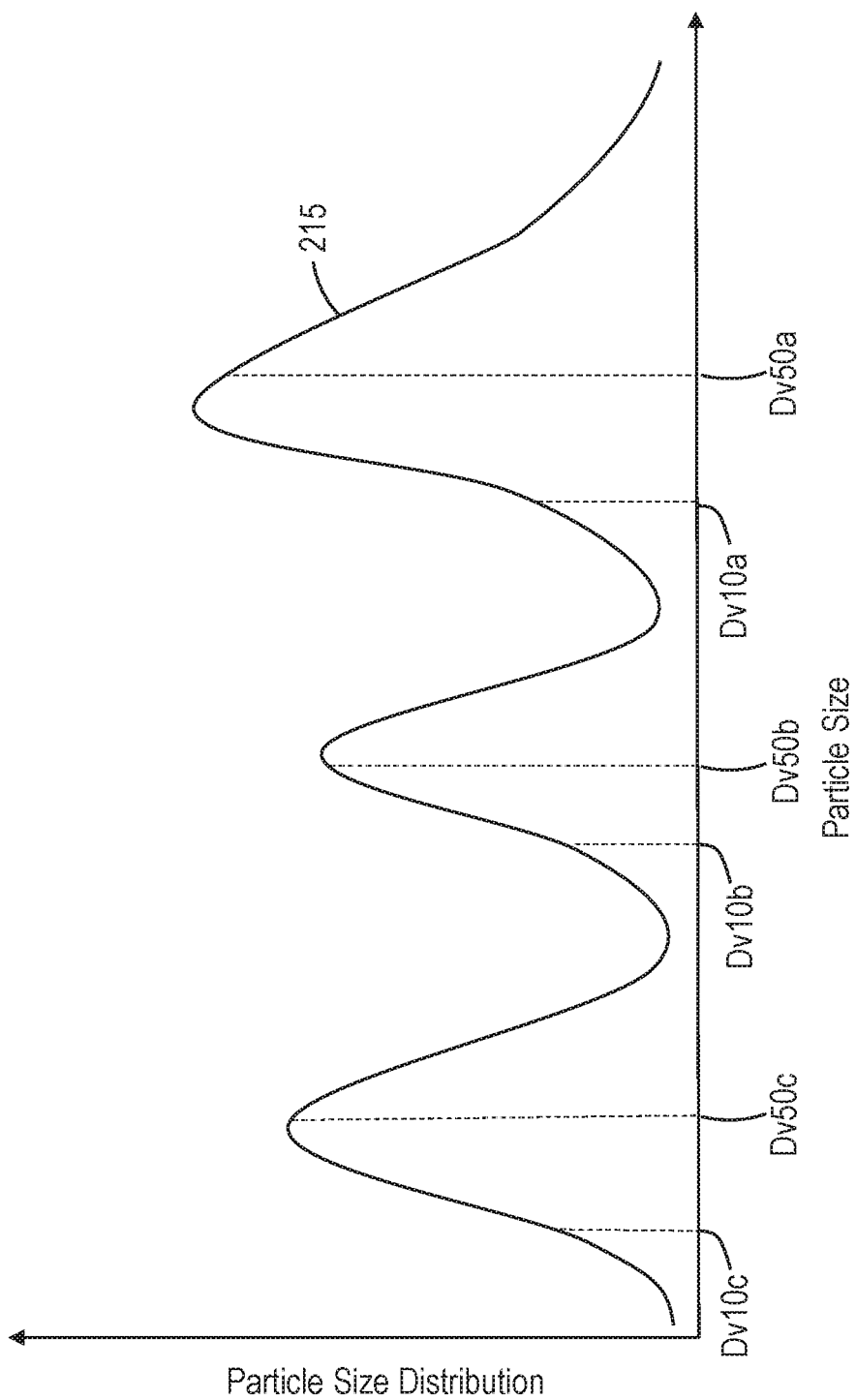

FIGS. 4A-4B are schematic plots of an illustrative particle size distribution 215 which is a trimodal distribution in the illustrated embodiment. The particle size distribution 215 has first, second and third peaks 110a, 110b and 110c at respective first, second and third particle sizes d1, d2 and d3 with corresponding respective full width at half maxima 112a, 112b and 112c. The first, second and third peaks 110a, 110b and 110c may be provided by respective first, second and third particles (e.g., corresponding to first, second and third particles 10, 20 and 30). In some embodiments, one (the first particles, or the second particles, or the third particles) of the first particles, the second particles and the third particles are coated with an electromagnetically absorptive coating while the others of the first particles, the second particles and the third particles are not coated with an electromagnetically absorptive coating. For example, in some embodiments, the first particles, but not the second and third particles, are coated with an electromagnetically absorptive coating. The first, second and third particles can have first, second and third Dv10 values Dv10a, Dv10b and Dv10c; and respective first, second and third Dv50 values Dv50a, Dv50b and Dv50c. In some embodiments, Dv10a>Dv50b and Dv10b>Dv50c. In some such embodiments or in other embodiments, Dv50a is in a range of about 30 microns to about 150 microns, Dv50b is in a range of about 5 microns to about 25 microns, and Dv50c is in a range of about 0.5 microns to about 4 microns. In some such embodiments or in other embodiments, Dv50a is in a range of about 50 microns to about 100 microns, Dv50b is in a range of about 7 microns to about 15 microns, and Dv50c is in a range of about 1 micron to about 2.5 microns. In some embodiments, d1 is in a range of about 40 microns to about 150 microns, d2 is in a range of about 4 microns to about 30 microns, and d3 is in a range of about 0.5 microns to about 4 microns. In some embodiments, d1 is in a range of about 50 microns to about 100 microns, d2 is in a range of about 5 microns to about 20 microns, and d3 is in a range of about 1 micron to about 3 microns.

Figure 5:
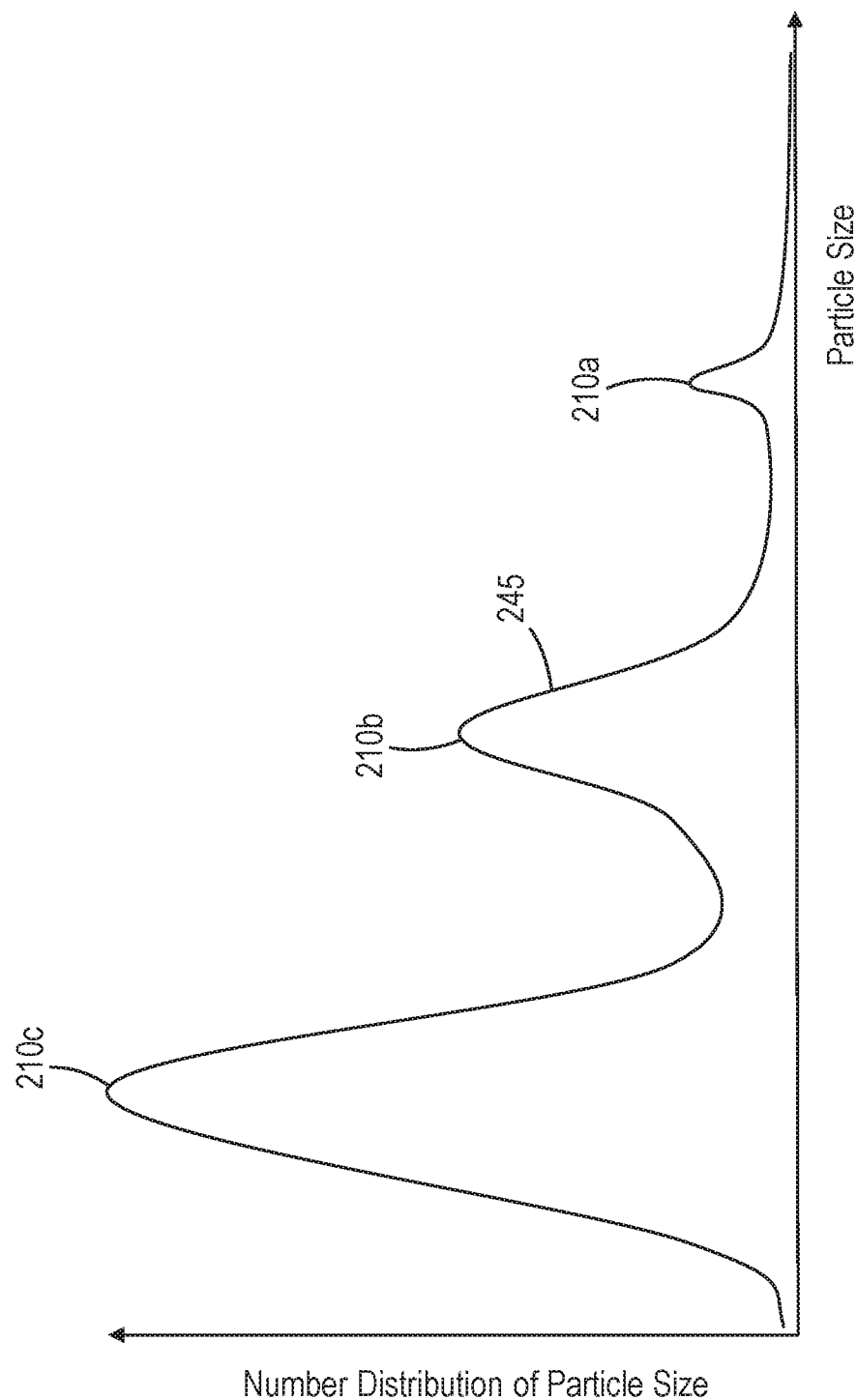
FIG. 5 is a schematic plot of an illustrative number distribution of particle sizes.

FIG. 5 is a schematic plot of an illustrative number distribution 245 of particle sizes. The number distribution is a trimodal distribution in the illustrated embodiment and has first, second and third peaks 210a, 210b and 210c corresponding to respective first, second and third particles (e.g., 10, 20 and 30). In some embodiments, the total number of the first particles is a small fraction (e.g., at most 1%, or at most 0.1%, or at most 0.01%) of the total number of first, second and third particles as schematically indicated in FIG. 5. For example, if Dv50a (see, e.g., FIG. 4B) were about 40 times Dv50c (see, e.g., FIG. 4B) and the volumes of the first and third particles were about the same, a ratio of the number of the third particles to the number of the first particles would be approximately $40^3$=64,000. In other embodiments, the coated first particles that are a small fraction of the total number of particles have a size smaller than at least one of the second and third particles.

In some embodiments, a thermally conductive electromagnetically absorbing material 100 includes a plurality of thermally conductive particles (e.g., particles 10, 20 and 30) dispersed in a binder 40 at a volume loading of at least about 50 percent. The particles have a particle size distribution (e.g., distribution 215) including peaks at particle sizes d1, d2 and d3, where d1>d2>d3. In some such embodiments or in other embodiments, at least a majority of particles within a half width at half maximum (HWHM) of the peak corresponding to the particles size d1, but not d2 and d3, are at least partially coated with an electromagnetically absorbing coating 12. In some embodiments, the material 100 includes the plurality of thermally conductive particles dispersed in the binder 40 at a volume loading of at least about 50 percent, or at least about 55 percent, or at least about 60 percent, or at least about 65 percent, or at least about 70 percent. In some embodiments, the volume loading of the thermally conductive particles is no more than about 82 percent.

In some embodiments, a thermally conductive electromagnetically absorbing material 100 includes a plurality of particles (e.g., particles 10, 20 and 30) dispersed in a binder 40. The plurality of particles has a particle size distribution (e.g. distribution 215) including at least three peaks (e.g., 110a, 110b and 110c). At least a majority of particles within a half width at half maximum (HWHM) of one (e.g., 110a), but not the other ones (e.g., 110b and 110c), of the at least three peaks are at least partially coated with an electromagnetically absorbing coating 12. In some embodiments, at least 75%, or at least 80%, or at least 85%, or at least 90%, or at least 95% of the particles within the HWHM of one, but not the other ones, of the at least three peaks are at least partially coated with an electromagnetically absorbing coating 12. In some embodiments, at least 20%, or at least 30%, or at least 40%, or at least 50%, or at least 60%, or at least 70% of the at least majority of the particles within the HWHM of the one of the at least three peaks that are at least partially coated with the electromagnetically absorbing coating 12, are only partially coated with the electromagnetically absorbing coating 12 (see, e.g., FIG. 2A). In some embodiments, the at least majority of the particles within the HWHM of the one of the at least three peaks that are at least partially coated with the electromagnetically absorbing coating 12, are further coated with an electrically insulative material 14. In some embodiments, the particle size distribution 215 includes peaks at three particle sizes d1, d2 and d3, where d1>d2>d3, and at least a majority of particles within a HWHM of the peak 110a corresponding to the particles size d1, but not d2 and d3, are at least partially coated with an electromagnetically absorbing coating 12.

In some embodiments, the loadings of the first, second and third particles are in a ratio of about A:B:C by weight or by volume, where A is in a range of about 2 to about 4, B is in a range of about 0.5 to about 1.5, and C is in a range of about 0.5 to about 1.5. In some embodiments, A is in a range of about 2.5 to about 3.5, B is in a range of about 0.75 to about 1.25, and C is in a range of about 0.75 to about 1.25. In one example, the loadings of the first, second and third particles are in a ratio of about 3:1:1 by weight or by volume; the first particles 10 have a Dv50 of about 70 microns and a Dv10 of about 40 microns; the second particles 20 have a Dv50 of about 10 microns and a Dv10 of about 4 microns; and the third particles 30 have a Dv50 of about 1 to 2 microns.

The particle size distribution may be significantly different than those schematically illustrated in FIGS. 4A-4B. For example, the relative sizes of the peaks may be significantly different than illustrated. In some embodiments, the peak 110a is larger than the peaks 110b and 110c. The peaks 110b and 110c may have similar values, or 110b may be larger than 110c, or 110b may be smaller than 110c. As another example, d1 may be moved further to the right (larger particle size) and/or d2 may be moved further to the left (smaller particle size) so that d2 and d3 are closer and d1 and d2 are farther apart. As still another example, d1 and d2, and/or d2 and d3, may be moved closer to one another. In some embodiments, the distribution for the peaks 110b and 110c merge into one broader peak.

Figure 6A:
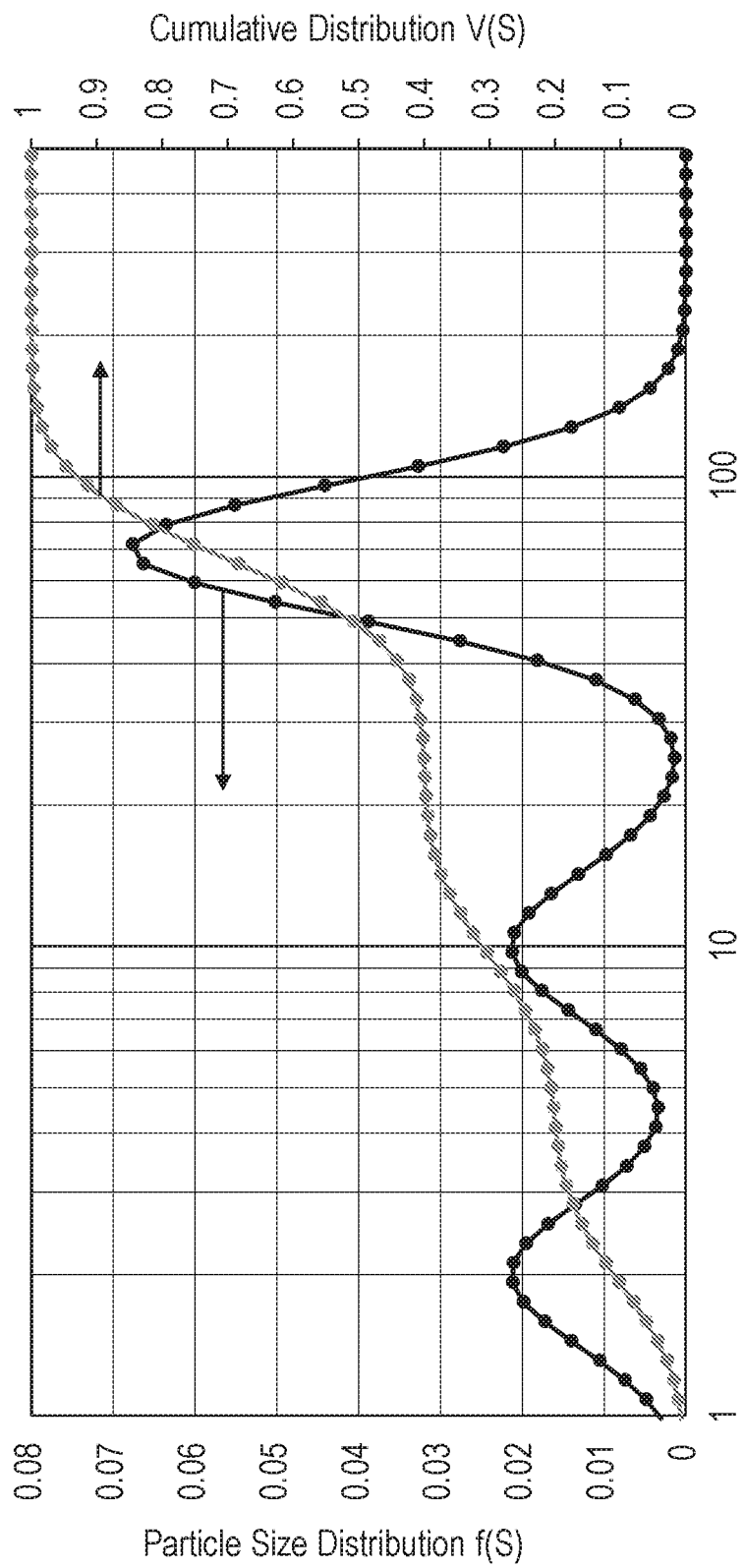
FIGS. 6A-6B are plots of illustrative calculated particle size distributions.

FIG. 6A is a plot of an illustrative calculated particle size distribution f(S) of a plurality of particles including first, second and third particles having respective individual particle size distributions with peaks at 70 microns, 10 microns and 2 microns, respectively. The individual distributions for the first, second and third particles were taken to have the shape of a normal distribution when plotted on a linear-log plot. The ratio of the volumes of the first, second and third particles was 3:1:1. The cumulative distribution V(S) is also shown in the figure.

Figure 6B:
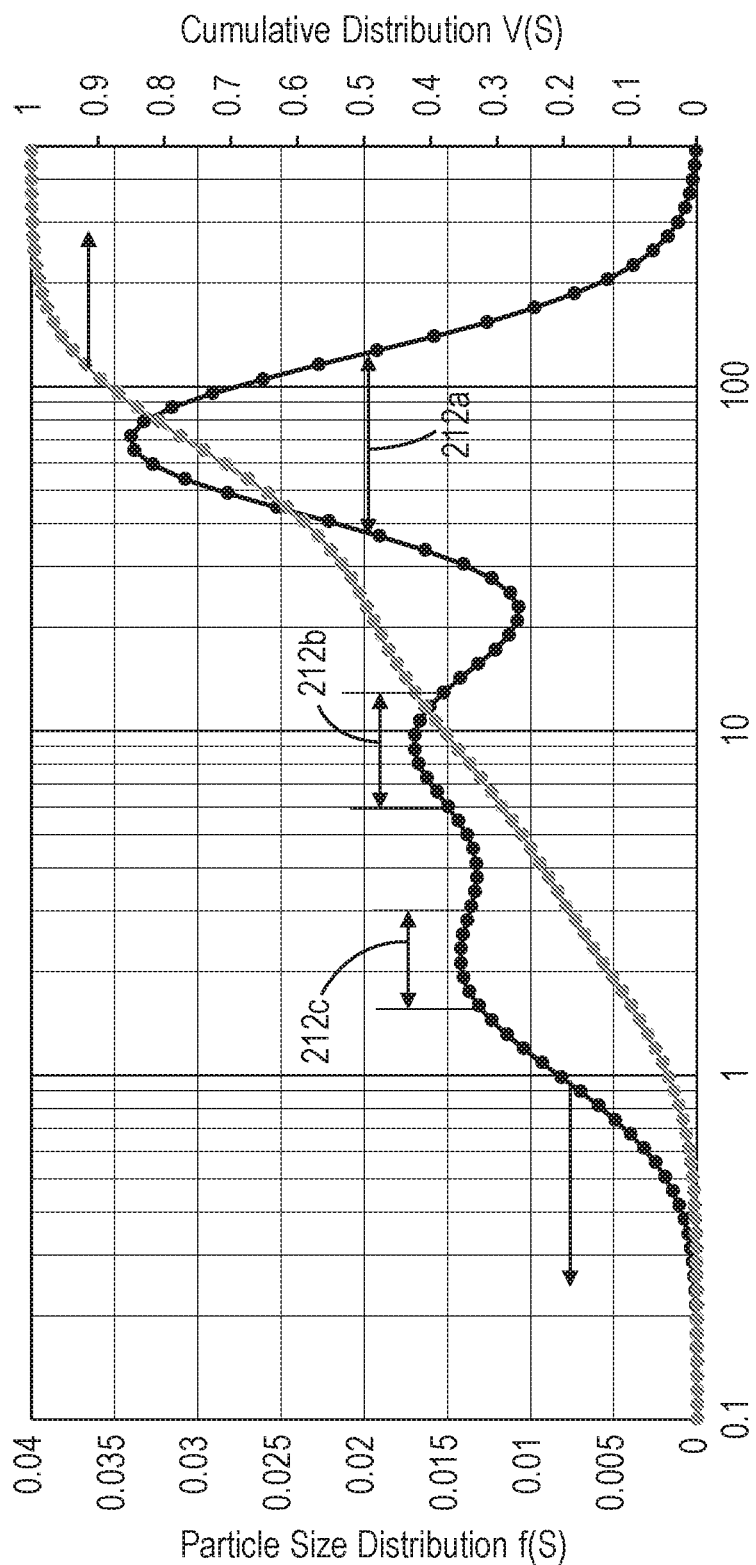

FIG. 6B is a plot of an illustrative calculated particle size distribution f(S), and corresponding cumulative distribution V(S), of a plurality of particles that was determined similarly to FIG. 6A except that the widths of the individual distributions for the first second and third particles were increased and the ratio of the volumes of the first, second and third particles was 2:1:1. The cumulative distribution V(S) is also shown. When distributions start to merge between adjacent peaks, a full width at half maximum can be determined by defining the half maximum to be halfway between the peak maximum and the minimum value of the distribution between the adjacent peaks (the larger of the minimum value can be used when a distribution starts to merge with adjacent peaks on each side). This full width at half maximum may be referred to as a local full width at half maximum. Full widths at half maxima 212a, 212b and 212c are schematically indicated on the plot.

Figure 7:
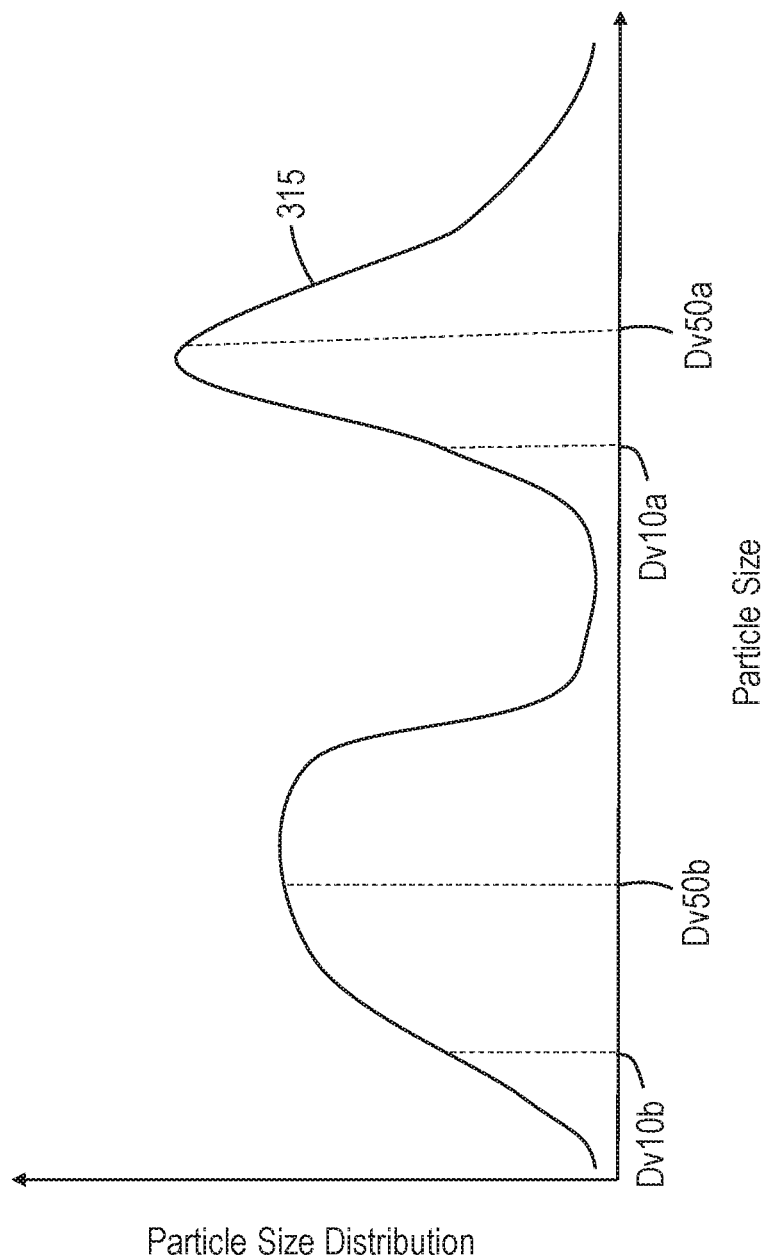
FIG. 7 is a schematic plot of an illustrative bimodal particle size distribution.

FIG. 7 is a schematic plot of an illustrative particle size distribution 315 which is a bimodal distribution in the illustrated embodiment. The particle size distribution 315 has first and second peaks at respective first and second particle sizes with corresponding respective full width at half maxima (not labeled in the figure). The first and second peaks may be provided by respective first particles (e.g., corresponding to first particles 10) and second particles (e.g., corresponding to the second particles 20 and/or the third particles 30). The first and second particles can have first and second Dv10 values Dv10a and Dv10b; and respective first and second Dv50 values Dv50a and Dv50b. The Dv50 size of the first particles may be denoted a1 and the Dv50 size of the second particles may be denoted a2. In some embodiments, a thermally conductive electromagnetically absorbing 100 includes a plurality of first particles 10 dispersed in a binder 40 and having a first Dv50 size a1 and a plurality of second particles (e.g., particles 20 and/or 30) dispersed in the binder 40 and having a second Dv50 size a2. In some embodiments, a1/a2≥1.5, or a1/a2≥2, or a1/a2≥3 or a1/a2≥5. In some embodiments, 50≥a1/a2≥1.5 or 20≥a1/a2≥2. In some embodiments, the first particles include at most 1%, or 0.1%, or 0.01% of a total number of the first and second particles and are more electromagnetically absorbing than the second particles (e.g., in some embodiments, the first particles, but not the second particles, are coated with an electromagnetically absorbing coating as described further elsewhere). In some embodiments, the first particles include 0.0001% to 0.1% of the total number of particles. In some embodiments, the first particles include at most 1%, or 0.1%, or 0.01% of a total number of the first and second particles and include at least 30%, or at least 40%, or 30% to 80% of a total volume of the first and second particles. In some embodiments, each particle in at least a majority of the first particles includes a thermally conductive electrically insulative core 11 at least partially coated with an electromagnetically absorbing coating 12. In some embodiments, the electromagnetically absorbing coating 12 is or includes an electrically conductive material. In some such embodiments, or in other embodiments, the at least majority of the first particles are further at least partially coated with an electrically insulative material 14.

In some embodiments, the second particles have multiple peaks instead of a single peak. In some embodiments, the plurality of second particles has a particle size distribution including peaks at particle sizes S1 (e.g., corresponding to d3 depicted in FIG. 4A) and S2 (e.g., corresponding to d2 depicted in FIG. 4A), where a1>S1 and S2. In some embodiments, the plurality of first particles has a particle size distribution including a peak at a particle size d1, the plurality of second particles has a particle size distribution including peaks at particle sizes S1 and S2, and d1>S1 and S2. In some embodiments, each particle in at least a majority of the second particles is thermally conductive and electrically insulative.

In any of the embodiments described herein, the material 100 may have a thermal conductivity of at least 2 W/(m-K) along at least one direction. In some such embodiments or in other embodiments, for an at least one frequency f in a frequency range from about 20 GHz to about 120 GHz, the material 100: has a relative real permittivity of less than about 10; and attenuates a substantially normally incident radiation 75 having the at least one frequency by at least 5 dB/mm, or at least 5.5 dB/mm, or at least 6 dB/mm. The thermal conductivity can be in a range of 2 W/(m-K) to 7 W/(m-K) or 5 W/(m-K), for example, along the at least one direction. The thermal conductivity can be at least 2.5 W/(m-K) or at least 3 W/(m-K) along the at least one direction. In some embodiments, the thermal conductivity is at least 2 W/(m-K), or at least 2.5 W/(m-K), or at least 3 W/(m-K) along each of three mutually orthogonal directions. In some embodiments, for the at least one frequency f, the material 100 has a loss tangent of at least 0.1, or at least 0.2, or in a range of 0.1 to 1, for example. The relative real permittivity can be less than about 9, or in a range of about 5 to about 10, for example. A low (e.g., less than about 10) relative real permittivity is desired in some cases as this results in reduced surface reflections from the material. In some embodiments, an anti-reflection film is disposed on at least one surface of a layer or article formed from the material 100 to further reduce surface reflections. In other embodiments, the material 100 can have a real relative permittivity of about 10 or higher, which would typically result in surface reflections resulting from the difference in relative permittivity of the material and air, for example, but an anti-reflection film can be disposed on at least one surface of a layer or article formed from the material to reduce these surface reflections In some embodiments, the binder 40 is a polymeric binder. In some embodiments, the binder 40 includes at least one of nylon, polyolefin (e.g., thermoplastic polyolefin (TPO)), epoxy, silicone, or acrylate.

In some embodiments, the thermally conductive particles (e.g., 10, 20 and/or 30) include at least one of metal oxides, metal carbides, metal hydrates or metal nitrides. In some embodiments, the thermally conductive particles (e.g., 10, 20 and/or 30) include at least one of alumina (e.g., one or more of alpha alumina particles, substantially spherical alumina particles, or polyhedral alumina), boron nitride, magnesium oxide, zinc oxide, aluminum nitride, silicon carbide, aluminum nitride, or aluminum hydroxide.

In some embodiments, the electromagnetically absorbing coating 12 includes a metal or a semiconductor. In some embodiments, the electromagnetically absorbing coating 12 includes one or more of tungsten, aluminum, titanium, steel, chromium, or nickel. In some embodiments, the electromagnetically absorbing coating 12 includes tungsten. It is typically desired that when the electromagnetically absorbing coating 12 is a metal that it is sufficiently thin that it results in significant electromagnetic absorption in a desired frequency range (e.g., via dielectric relaxation as described in Bowler, "Designing Dielectric Loss at Microwave Frequencies using Multi-Layered Filler Particles in a Composite", IEEE Transactions on Dielectrics and Electrical Insulation Vol. 13, No. 4, pp. 703-711, August 2006). When the metal layer is sputtered onto the particle, metals such as tungsten that tend to form a monolayer are typically preferred.

In some embodiments, the particles coated with coating 12 are further coated with an electrically insulative material 14 (see, e.g., FIG. 2B). The material 14 can be a non-conductive metal oxide such as aluminum oxide.

In some embodiments, the material 100 is provided in the form of injection moldable pellets, a molded article, or a film. For example, the material 100 can be formed by mixing the particles with a binder at elevated temperatures (e.g., above a melting point of the binder). The material 100 can then be extruded as a film, for example, or pellets can be formed via extrusion palletization, for example. Alternatively, pellets can be formed from extruded or otherwise formed material by grinding or otherwise pelletizing the material. The pellets can be used to form an article via injection molding, for example.

Figure 8A:
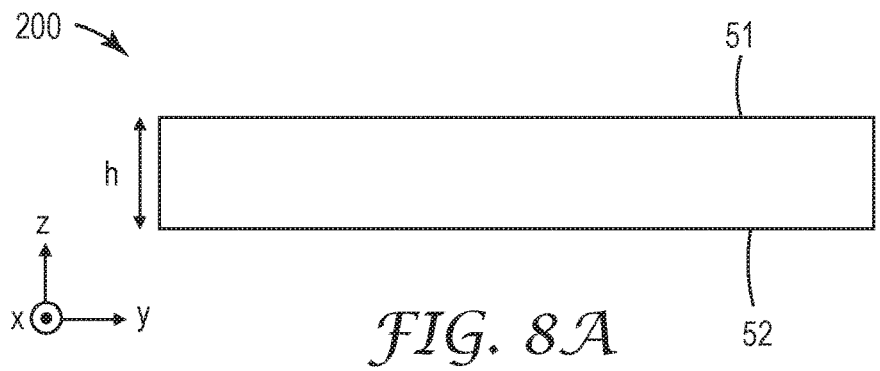
FIG. 8A is a schematic cross-sectional view of an illustrative film.

FIG. 8A is a schematic cross-sectional view of an illustrative film 200 which can include or be formed from the thermally conductive electromagnetically absorbing material 100, for example. In the illustrated embodiment, the film extends generally in orthogonal first and second directions (x- and y-directions). The film 200 has opposing first and second major surfaces 51 and 52 and a separation h (thickness in z-direction) between the first and second major surfaces 51 and 52. In some embodiments, the separation h is between about 0.1 mm and about 5 mm or between about 0.5 mm and about 5 mm. The thickness chosen for the film can depend on the frequency range that it is desired to attenuate (e.g., thicker films can be used for lower frequencies) and/or on the desired electromagnetic absorption (e.g., thicker films can be used for higher absorption). In some embodiments, the film 200 has a thermal conductivity of at least 2 W/(m-K), or at least 2.5 W/(m-K), or at least 3 W/(m-K) between the first and second major surfaces 51 and 52 along a thickness direction (z-direction) of the film 200. The thermal conductivity can be in a range of 2 W/(m-K) or 2.5 W/(m-K) to 7 W/(m-K) or 5 W/(m-K), for example.

In some embodiments, an anti-reflection film is disposed on at least one surface (e.g., a major surface or opposing major surfaces) of a film or other article that includes the thermally conductive electromagnetically absorbing material 100. For example, an anti-reflection film can be disposed on at least one of the first and second major surfaces 51 and 52 of the film 200. The anti-reflection film can include one or more quarter wave layers. Anti-reflection films including quarter wave layers, which can have refractive indices selected to reduce or minimize reflection, are known in the art. The anti-reflection film can include one, two or more layers. Including a larger number of layers can provide an anti-reflection effect over a larger wavelength range. It has been found that including one or more anti-reflection films can increase the electromagnetic absorptivity of the thermally conductive electromagnetically absorbing material 100 in a desired frequency range.

Figure 8B:
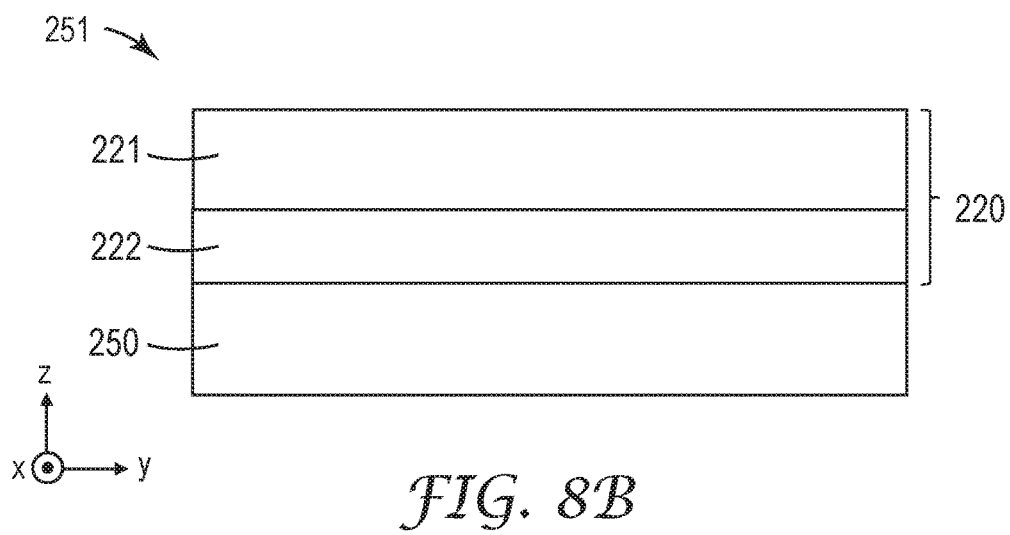
FIG. 8B is a schematic cross-sectional view of an illustrative article including an anti-reflection film.

FIG. 8B is a schematic cross-sectional view of an illustrative article 251 including an anti-reflection film 220 disposed on a layer 250 which can include or be formed from the thermally conductive electromagnetically absorbing material 100, for example. The layer 250 can correspond, for example, to the film 200 or to the molded article 350 described further elsewhere. The film 220 can be an anti-reflection film for at least one frequency in a range of about 20 GHz to about 120 GHz, for example. The anti-reflection film 220 can be or include a quarter wave layer or a quarter wave stack, for example. In the illustrated embodiment, the anti-reflection film 220 includes a first layer 221 and a second layer 222, each of which can have an optical thickness of about ¼ of a wavelength (or, equivalently, a physical thickness of about ¼ c/(f√ε) for a frequency f and real relative permittivity ε where c is the speed of light in vacuum) for at least one frequency in a range of about 20 GHz to about 120 GHz, for example. In some embodiments, the anti-reflection film 220 includes at least a first layer 221 and a second layer 222 and may further include additional layers (e.g., additional quarter wave layers). In some embodiments, for at least one frequency in a range of about 20 GHz to about 120 GHz, the first layer 221 has a real relative permittivity less than that of the second layer 222, and the second layer 222 has a real relative permittivity less than that of the layer 250. In some embodiments, for at least one frequency in a range of about 20 GHz to about 120 GHz, the first layer 221 has a real relative permittivity in a range of about 1.1 to about 2, the layer 250 has a real relative permittivity of less than about 10, and the second layer 222 has a real relative permittivity greater than the real relative permittivity of the first layer 221 and less than the real relative permittivity of the layer 250.

Figure 8C:
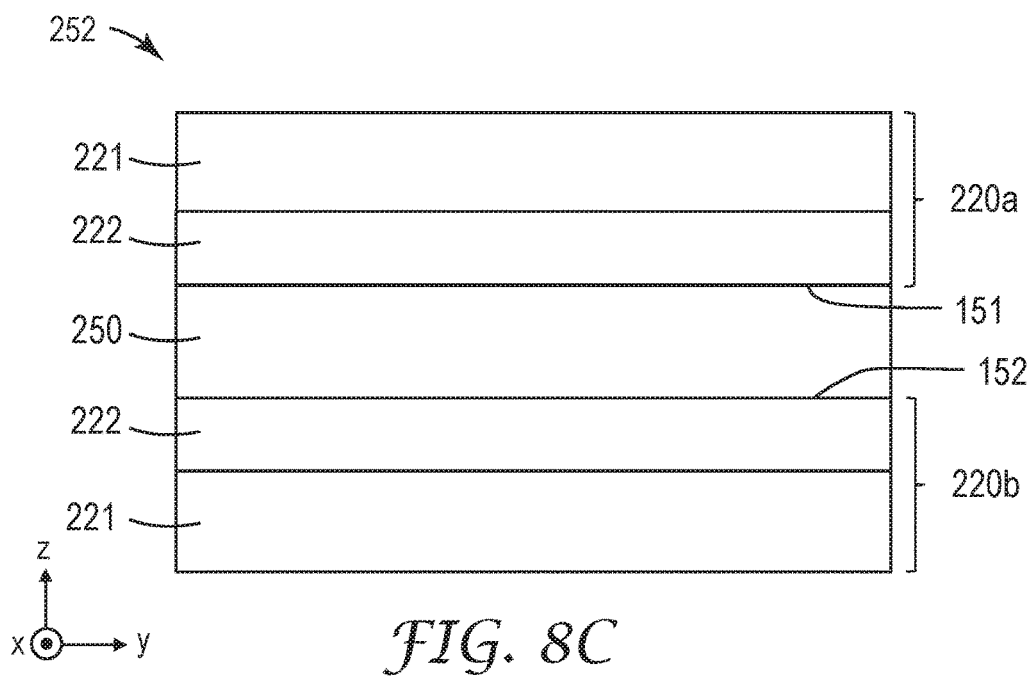
FIG. 8C is a schematic cross-sectional view of an illustrative article including two anti-reflection films.

A second anti-reflection film can optionally also be included. For example, in some cases, it is desired to reduce reflection from two different directions. FIG. 8C is a schematic cross-sectional view of an illustrative article 252 including a first anti-reflection film 220a disposed on a first major surface 151 of layer 250 and a second anti-reflection film 220b disposed on an opposite second major surface 152 of layer 250. Each of the films 220a and 220b can be an anti-reflection film for at least one frequency in a range of about 20 GHz to about 120 GHz. The first and second anti-reflection films 220a and 220b may be the same or different (e.g., different number of layers or different layer compositions). One or both of the anti-reflection films may be substantially coextensive with the respective major surface of the layer 250 or at least a portion of at least one of the major surfaces may be exposed to provide improved thermal contact of the layer 250 to an adjacent object or device.

In some embodiments, the first and second layers 221 and 222 include particles dispersed in a binder. In some embodiments, the first and second layers 221 and 222 and the layer 250 or the material 100 have a binder with a same composition. In some embodiments, at least some of the particles of at least one of the first and second layers 221 and 222 are at least partially coated with an electromagnetically absorptive coating. For example, the first and second layers 221 and 222 can include a plurality of particles as generally described for material 100 except that the first and second layers 221 and 222 may include a lower concentration of the particles and/or at least some of the particles may be replaced with low dielectric constant particles (e.g., hollow particles). In some embodiments, the real relative permittivities of the first and second layers 221 and 222 can be adjusted by adjusting the concentrations and types of the particles in the respective layer. In some embodiments, a lower permittivity is achieved by using hollow particles (e.g., glass or plastic bubbles optionally coated with an electromagnetically absorptive coating) and/or using a foamed binder. For example, in some embodiments, at least one of the first and second layers 221 and 222 include hollow particles dispersed in a binder. In some embodiments, for at least one frequency in a range of about 20 GHz to about 120 GHz, the first layer 221 has a loss tangent less than that of the second layer 222, and the second layer 222 has a loss tangent less than that of the layer 250. In some embodiments, for at least one frequency in a range of about 20 GHz to about 120 GHz, the layer 250 has a loss tangent in a range of about 0.1 or about 0.2 to about 1, the first layer 221 has a loss tangent greater than about 0.05, and the second layer 222 has a loss tangent greater than that of the first layer 221 and less than that of the layer 250.

Figure 9:
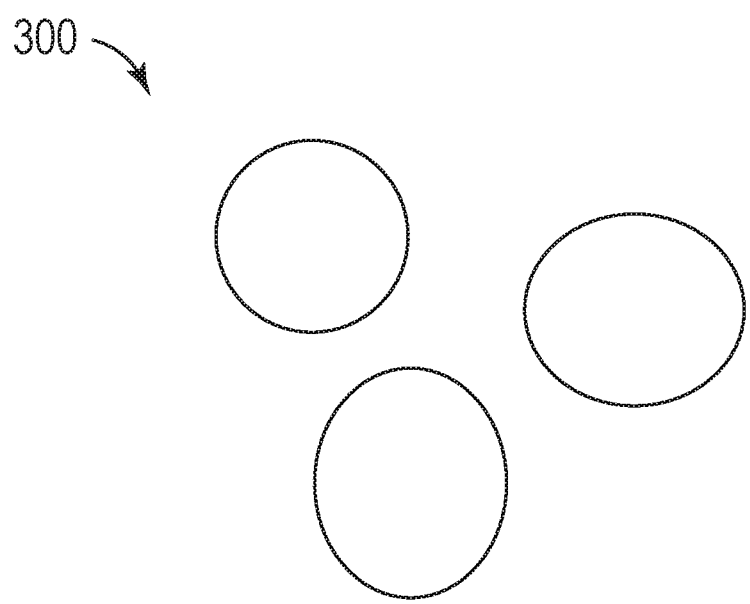
FIG. 9 is a schematic illustration of an illustrative plurality of pellets.

FIG. 9 is a schematic illustration of an illustrative plurality of pellets 300. The pellets 300 can be injection moldable pellets formed from the thermally conductive electromagnetically absorbing material 100. In some embodiments, a plurality of injection moldable pellets 300 is provided where each pellet in at least a majority of the pellets includes a thermally conductive electromagnetically absorbing material described elsewhere herein. In some embodiments, at least 60 weight percent, or at least 80 weight percent, or substantially all of the pellets 300 include the thermally conductive electromagnetically absorbing material.

Figure 10:
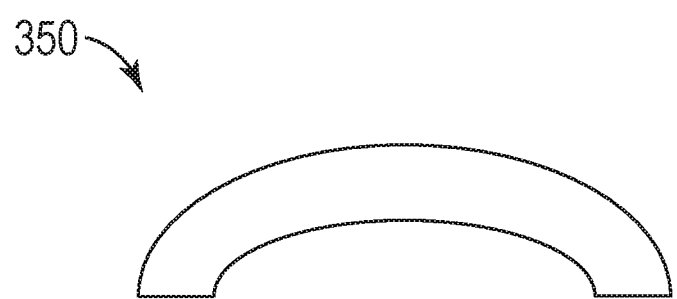
FIG. 10 is a schematic cross-sectional view of an illustrative molded article.

In some embodiments, a molded article is provided that includes a thermally conductive electromagnetically absorbing material described elsewhere herein. FIG. 10 is a schematic cross-sectional view of an illustrative molded article 350 which may be formed by injection molding the pellets 300, for example. The molded article 350 can have any suitable shape for a desired application.

The thermally conductive electromagnetically absorbing material and/or films or other articles formed from the material are useful in a wide variety of applications. The materials, films, or articles can be used in applications where electromagnetic shielding and/or thermal conductivity is desired.

Figure 11:
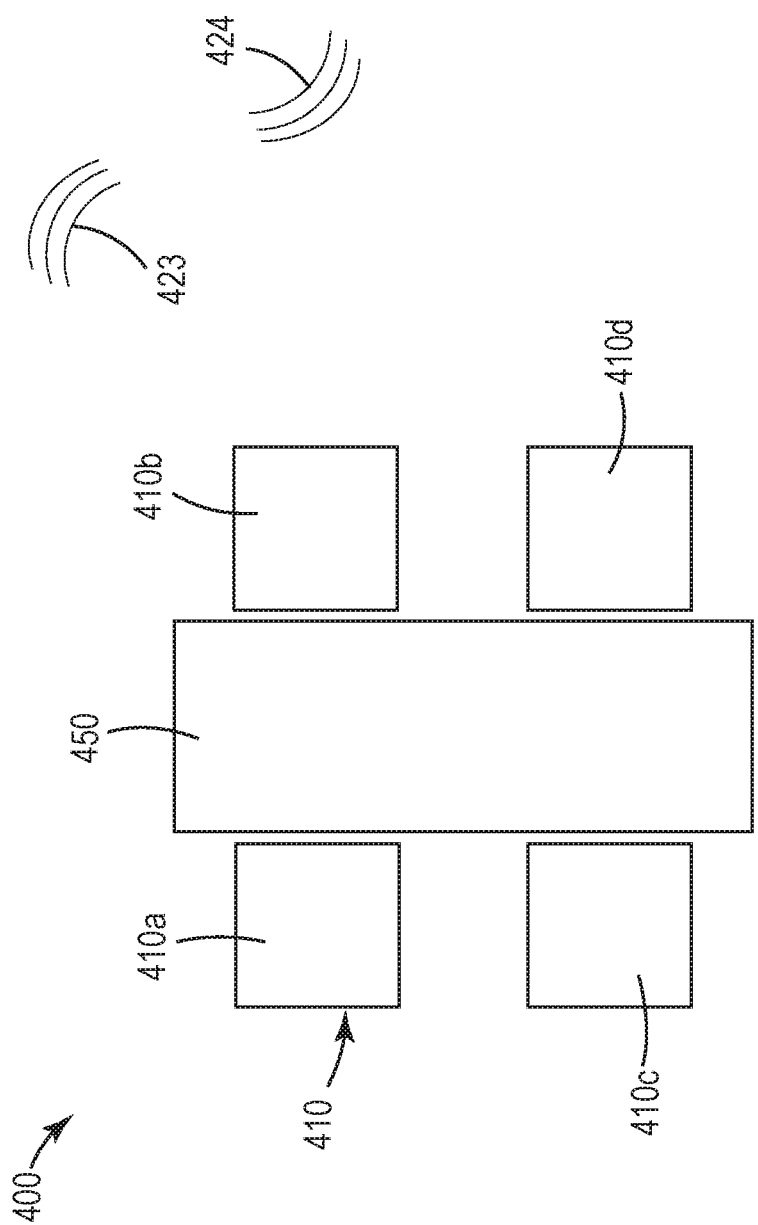
FIG. 11 is a schematic illustration of an illustrative system including a thermally conductive electromagnetically absorbing material.

FIG. 11 is a schematic illustration of an illustrative system 400 including an object or device 410 and thermally conductive electromagnetically absorbing material 450. Object or device 410 includes individual objects or devices 410a, 410b, 410c and 410d. One or more of the objects or devices 410a, 410b, 410c and 410d may optionally be omitted, or additional objects or devices may be included. Material 450 may correspond to material 100 and may be in the form of a film or a molded article, for example. The material 450 can be included to electromagnetically shield objects or devices 410a and 410b from one another and to electromagnetically shield objects or devices 410c and 410d from one another. Alternatively, or in addition, the material 450 can be included to transport (e.g., to reduce hot spots) and dissipate heat generated by the object or device 410. Additional material 450 may be included between objects or devices 410a and 410c and/or between objects or devices 410b and 410d. The system 400 can be one or more of a fifth generation (5G) wireless communication system, a sensor system, or a radar system, for example. In some embodiments, the object or device 410 is an antenna and the objects or devices 410a, 410b, 410c and 410d are an array of distinct spaced apart antenna elements (e.g., in a 5G wireless communication system). In other embodiments, the objects or devices 410a, 410b, 410c and 410d are a plurality of distinct spaced apart antennas (e.g., in a sensor system). In still other embodiments, the objects or devices 410a, 410b, 410c and 410d are electromagnetic receivers and/or transmitters (e.g., radar emitters in a radar system).

Figure 12:
FIG. 12 is a schematic cross-sectional view of an illustrative thermally conductive electromagnetically absorbing material disposed on an object or device.

The system 400 can include further components such an object or device 520 with a thermally conductive electromagnetically absorbing material 550 disposed on the object or device 520 as schematically illustrated in FIG. 12. Thermally conductive electromagnetically absorbing material 550 can correspond to material 100 or 450, for example. An anti-reflection film can optionally be disposed on the material 550 or 450 (see, e.g., FIGS. 8B-8C). The object or device 520 can be a metal object, an integrated circuit, or a circuit board, for example.

In some embodiments, system 400 is a fifth generation (5G) wireless communication system. In some embodiments, the 5G wireless communication system includes an antenna (e.g., object or device 410) including an array of distinct spaced apart antenna elements (e.g., objects or devices 410a, 410b, 410c and 410d) configured to at least one of receive and transmit a signal 423 and/or 424 having a frequency of between about 20 GHz and about 120 GHz. The 5G wireless communication system further includes the thermally conductive electromagnetically absorbing material 450 disposed between at least two antenna elements (e.g., 410a and 410b) in the array of antenna elements. The antenna can be a fifth generation (5G) antenna configured to operate at a 5G frequency band.

In some embodiments, system 400 is a sensor system. In some embodiments, the sensor system includes a plurality of distinct spaced apart antennas (e.g., 410a, 410b, 410c and 410d) configured to at least one of receive and transmit a signal 423 and/or 424 having a frequency of between about 20 GHz and about 120 GHz, and includes the thermally conductive electromagnetically absorbing material 450. The thermally conductive electromagnetically absorbing material 450 can be disposed proximate the plurality of distinct spaced apart antennas. In some embodiments, the thermally conductive electromagnetically absorbing material 450 is disposed between at least two of the antennas. In some embodiments, the sensor system includes an integrated circuit (e.g., object or device 520) and a thermally conductive electromagnetically absorbing material (e.g., material 550) disposed on the integrated circuit (e.g., to reduce electromagnetic interference). In some such embodiments or in other embodiments, the sensor system includes a metal object (e.g., object or device 520) and a thermally conductive electromagnetically absorbing material (e.g., material 550) disposed on the metal object (e.g., to reduce undesired reflections from the metal object). In some embodiments, the sensor system is a radar system including radar emitters which include the antennas.

In some embodiments, system 400 is a radar system. In some embodiments, the radar system includes at least first and second radar emitters (e.g., objects or devices 410a and 410b) and thermally conductive electromagnetically absorbing material 450 disposed between the first and second radar emitters. Additional radar emitters may optionally be included. In some embodiments, the first and second radar emitters are configured to transmit a signal 423 having a frequency of between about 76 GHz and about 81 GHz. The material 450 can be included to electromagnetically shield and/or transport heat from the first and second radar emitters. The radar system can also include an integrated circuit and/or a metal object with a thermally conductive electromagnetically absorbing material (e.g., material 550) disposed on the integrated circuit and/or metal object as described further elsewhere.

EXAMPLES

Materials

| Abbreviation | Description | Source |
|---|---|---|
| BAK-70 | Spherical alumina particles, Dv50 of about 70 microns | Bestry Performance Materials, Shanghai, China |
| BAK-30 | Spherical alumina particles, Dv50 of about 30 microns, Dv10 of about 14 microns, Dv90 of about 47 microns | Bestry Performance Materials, Shanghai, China |
| BAK-10 | Spherical alumina particles, spherical, Dv50 of about 10 microns | Bestry Performance Materials, Shanghai, China |
| TM-1250 | MARTOXID TM-1250 ground alumina particles, Dv50 of about 1.6 microns, Dv100 of about 20 microns | Huber Engineered Materials, Atlanta, GA |
| 3M 2216 | 3M SCOTCH-WELD epoxy adhesive | 3M Company, St. Paul, MN |

The particle size distributions of the BAK-70 and BAK-10 particles were measured by laser light scattering using a laser particle sizer (LS-POP(6) available from OMEC Instruments, Guangdong, China). Selected DvX values were determined and are summarized in the following table.

| Particles | Dv10 (μm) | Dv25 (μm) | Dv50 (μm) | Dv75 (μm) | Dv90 (μm) |
|---|---|---|---|---|---|
| BAK-70 | 40.68 | 55.46 | 71.22 | 88.95 | 106.92 |
| BAK-10 | 4.33 | 6.74 | 10.14 | 14.64 | 19.53 |

Tungsten Coating of BAK-70 Alumina Particles

A 5"×12" rectangular tungsten (W) sputter target was used to produce W thin film coated alumina particles. The apparatus used for the preparation of W thin film coated particles is described in U.S. Pat. Nos. 8,698,394 (McCutcheon et al.). 5786.29 g of BAK-70 alumina particles was loaded in the particle agitator assembly positioned inside the vacuum chamber. The vacuum chamber was pumped down to a base pressure of $1\times10^{-6}$ torr. Tungsten was sputtered for 6 hours at 1.0 kW at an argon sputtering gas pressure of 5 millitorr. The chamber was backfilled with Argon, a small portion of the W coated alumina particles was removed, and a powder resistivity of 150 ohm-cm was measured. The estimated thickness of the W coating was 6-7 nm.

Aluminum Oxide (AlOx) Coating on Tungsten Coated BAK-70 Alumina Particles

An aluminum oxide coating was made to encapsulate the W thin film to prevent from oxidation as generally described in U.S. Pat. No. 5,389,434 (Chamberlain et al.). A 5"×8" aluminum target was used in the same sputter coater and aluminum was sputtered. The AlOx layer was coated on top by admitting oxygen gas at a rate of 25 sccm (standard cubic centimeter per minute), in addition to argon sputter gas. The total pressure was kept at 10 millitorr. A cathodic power of 5.00 kW was applied for 5 hours with particle agitation of 15 rpm. At the end of 5 hours, the chamber was vented to ambient conditions and the particles were removed from the agitator. The powder resistivity of final aluminum oxide coating was >30E+06 ohm-cm range.

Example 1: Epoxy Composite with Tungsten and AlOx Coated BAK-70 Alumina

Alumina loaded epoxy composites having a total alumina volume loading of 70% were made using W and AlOx coated alumina, uncoated alumina and 3M 2216 two part epoxy.

120.34 g of W-AlOx coated BAK-70 alumina, 40.1 g of BAK-10 alumina, and 40.1 g of TM-1250 (ratio of 3:1:1) were mixed in a speed mixer at 2000 rpm for 2 min. To this 11.2 g each of part A and part B 3M 2216 epoxy was added and mixed with hand thoroughly. The mixture was placed in a speed mixer and mixed at 1200 rpm for 90 sec. under a vacuum of 30 ton. The mixture was then poured between 2 liners in a notch bar and made to a sheet with 1-2 mm thickness. The composite was cured at 93° C. for 1 hour.

The thermal conductivity was measured according to the ASTM D5470-17 test standard and determined to be 3.15 W(m-K).

Comparative Example C1

A sample was made as described for Example 1 except that each of the BAK-70, BAK-10, and TM-1250 particles were coated with tungsten and aluminum oxide as described for the BAK-70 particles of Example 1 prior to mixing the particles with the epoxy.

Comparative Example C2

A sample was made as described for Example 1 except that only BAK-30 particles were used. The BAK-30 particles were coated with tungsten and aluminum oxide as described for the BAK-70 particles of Example 1 prior to mixing the particles with the epoxy. The volume loading of the BAK-30 particles was about 50 percent by volume. The thermal conductivity was measured according to the ASTM D5470-17 test standard and determined to be 1.6 W(m-K).

Electromagnetic Properties

Scattering parameters S11 and S21 were determined for the sample in a waveguide for the frequency range of 26 to 40 GHz and for the sample in free space for the frequency range of 60 to 90 GHz. The complex permittivity was determined from the scattering parameters.

Figure 13:
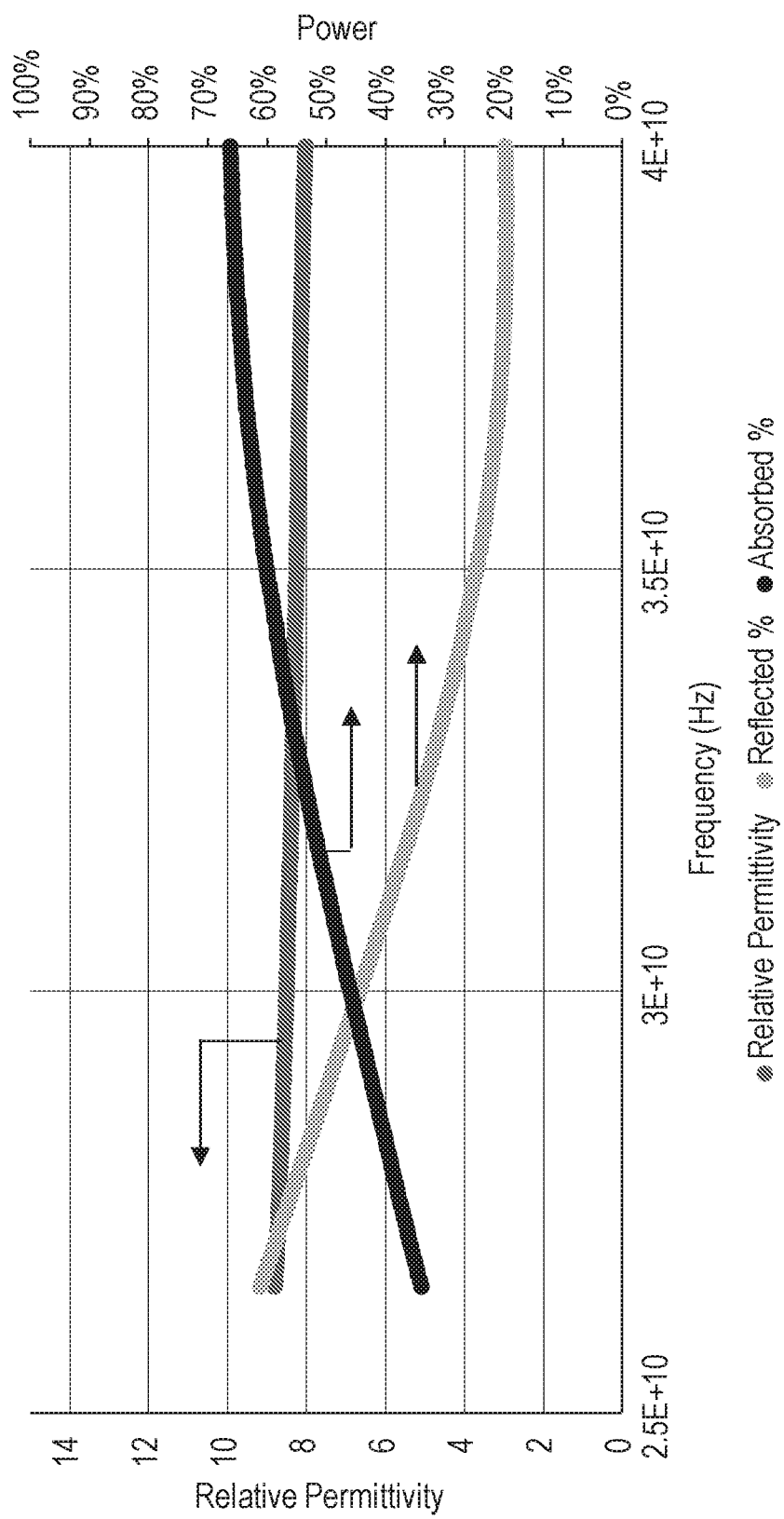
FIGS. 13-14 are plots of the real part of relative permittivity and of absorbed and reflected power for exemplary and comparative materials, respectively.
Figure 14:
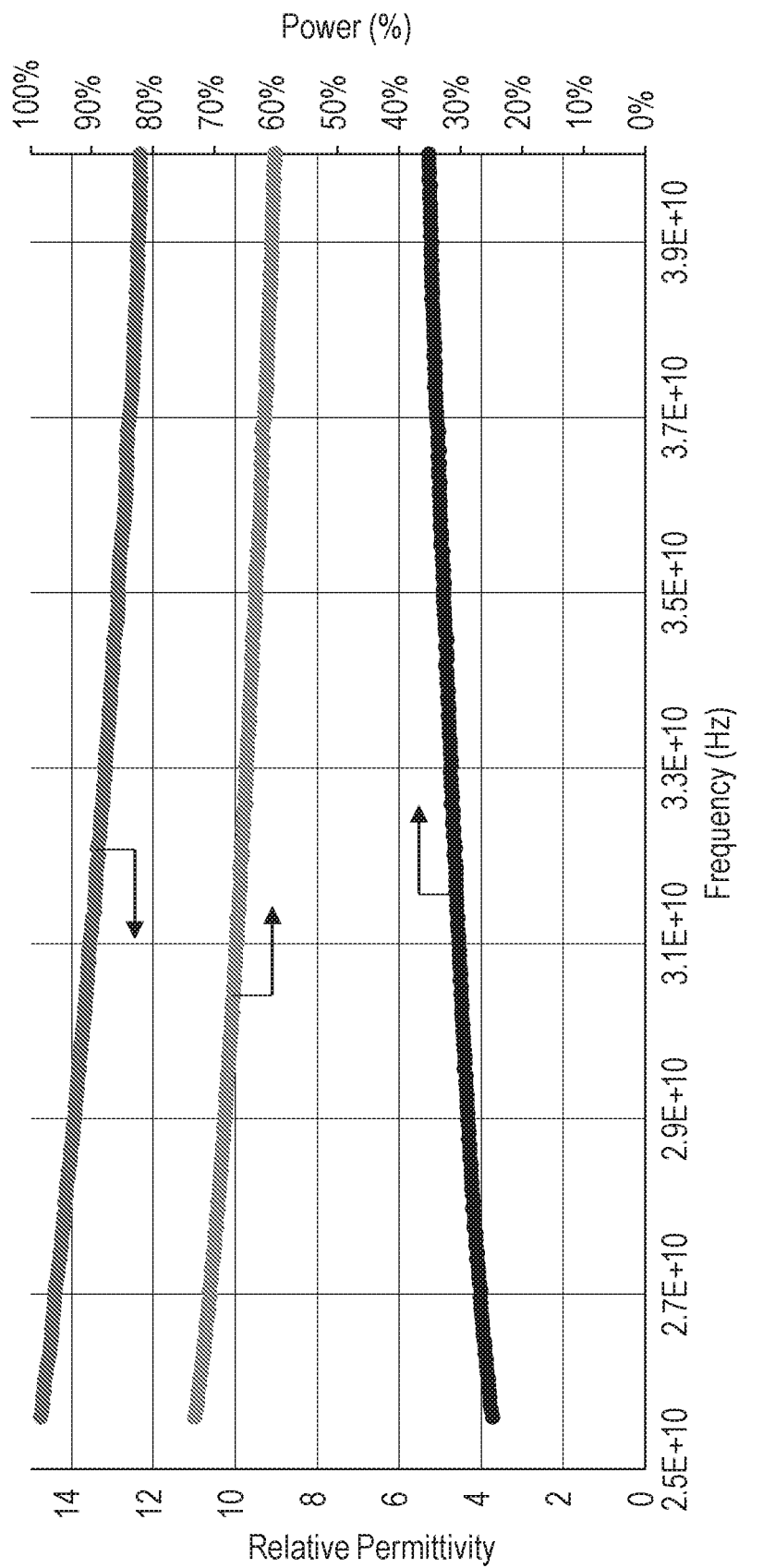

FIGS. 13-14 are plots of the real part of the relative permittivity and the absorbed and reflected power in the frequency range of 26 to 40 GHz for Example 1 and Comparative Example C1, respectively. From FIGS. 12-14 it can be seen that the absorbed power was substantially higher when only the BAK-70 particles were coated with tungsten.

Figure 15:
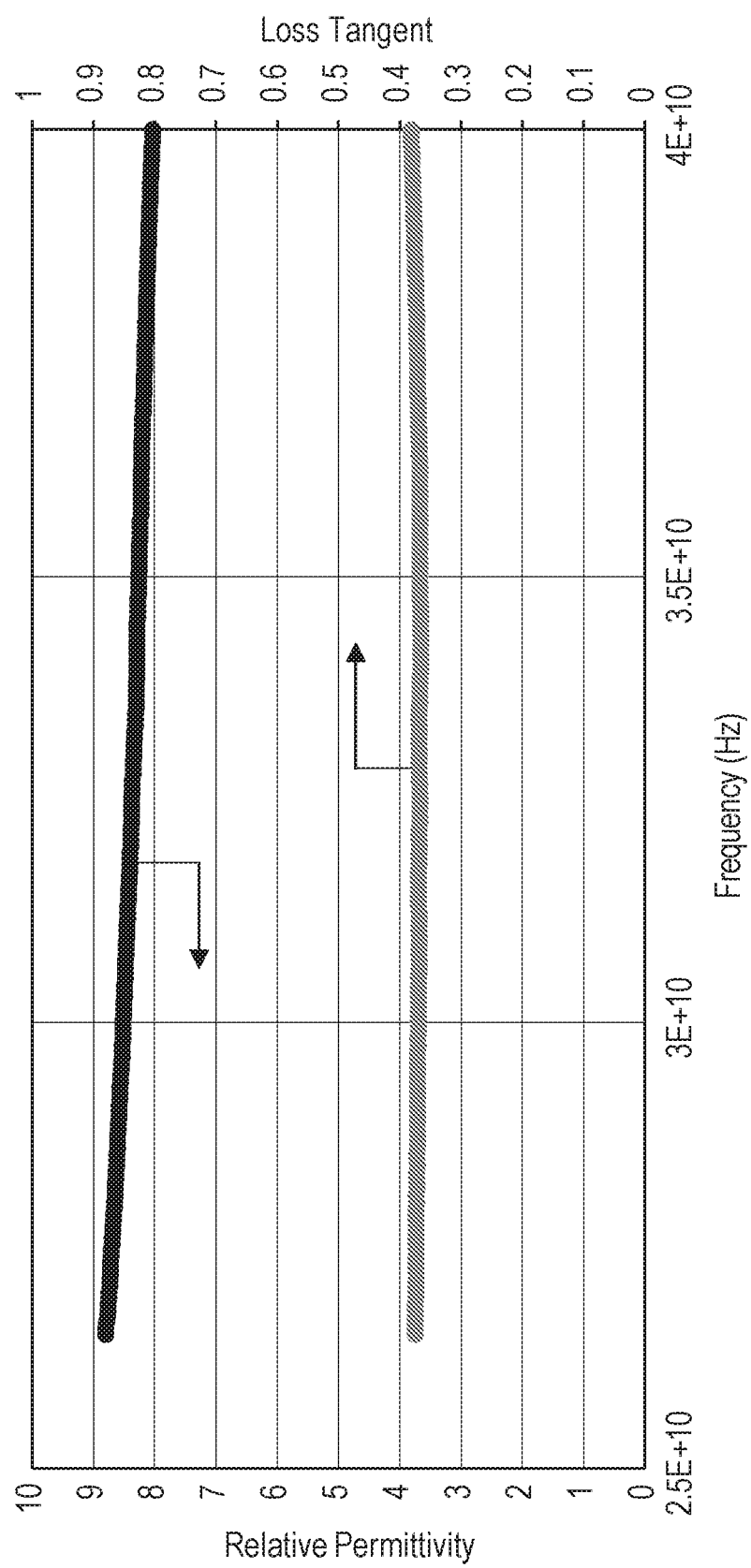
FIGS. 15-16 are plots of the real part of relative permittivity and of the loss tangent.
Figure 16:
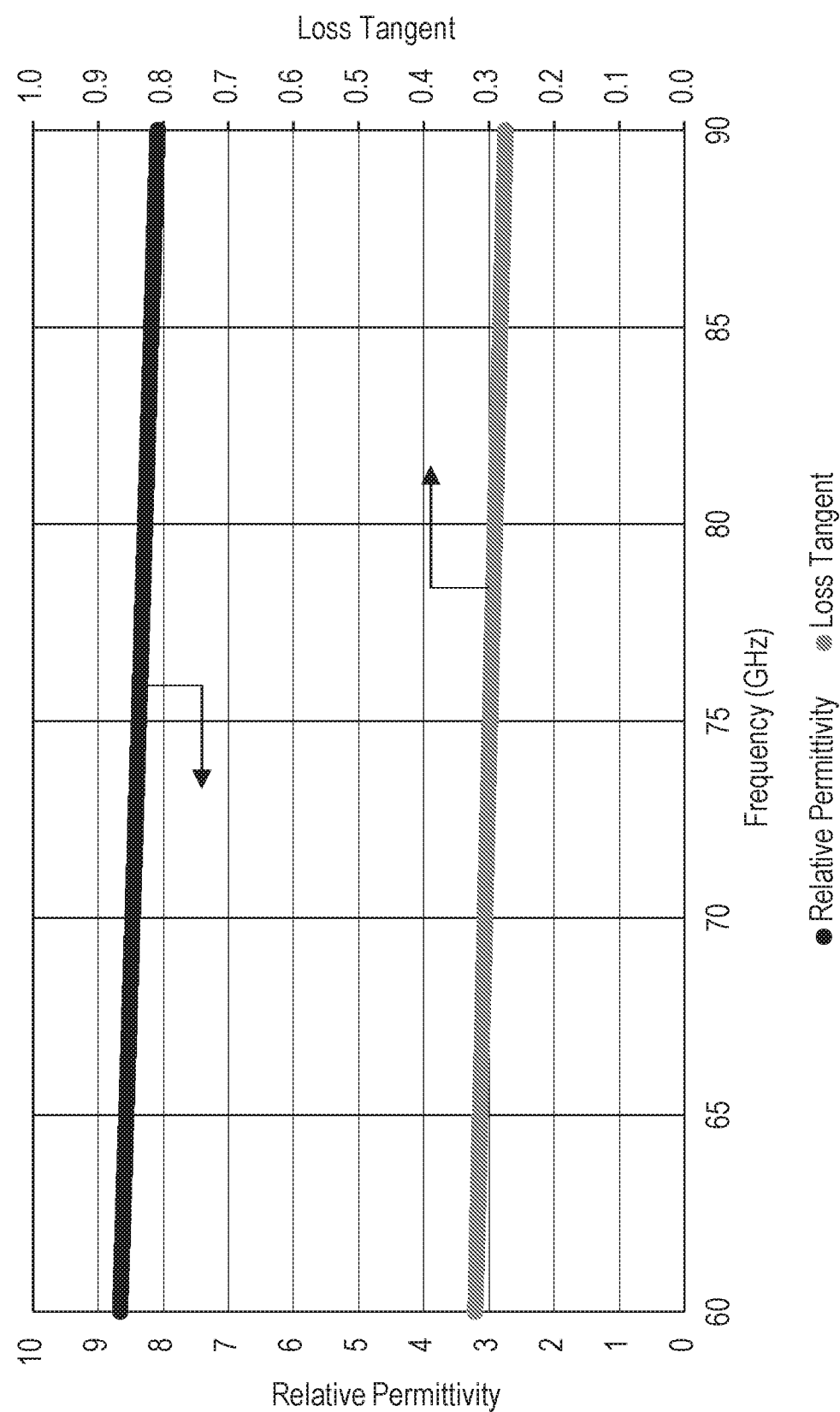

FIGS. 15-16 are plots of the real part of the relative permittivity and the loss tangent (tan delta) for the frequency ranges of 26 to 40 GHz and 60 to 90 GHz, respectively, for Example 1.

Figure 17:
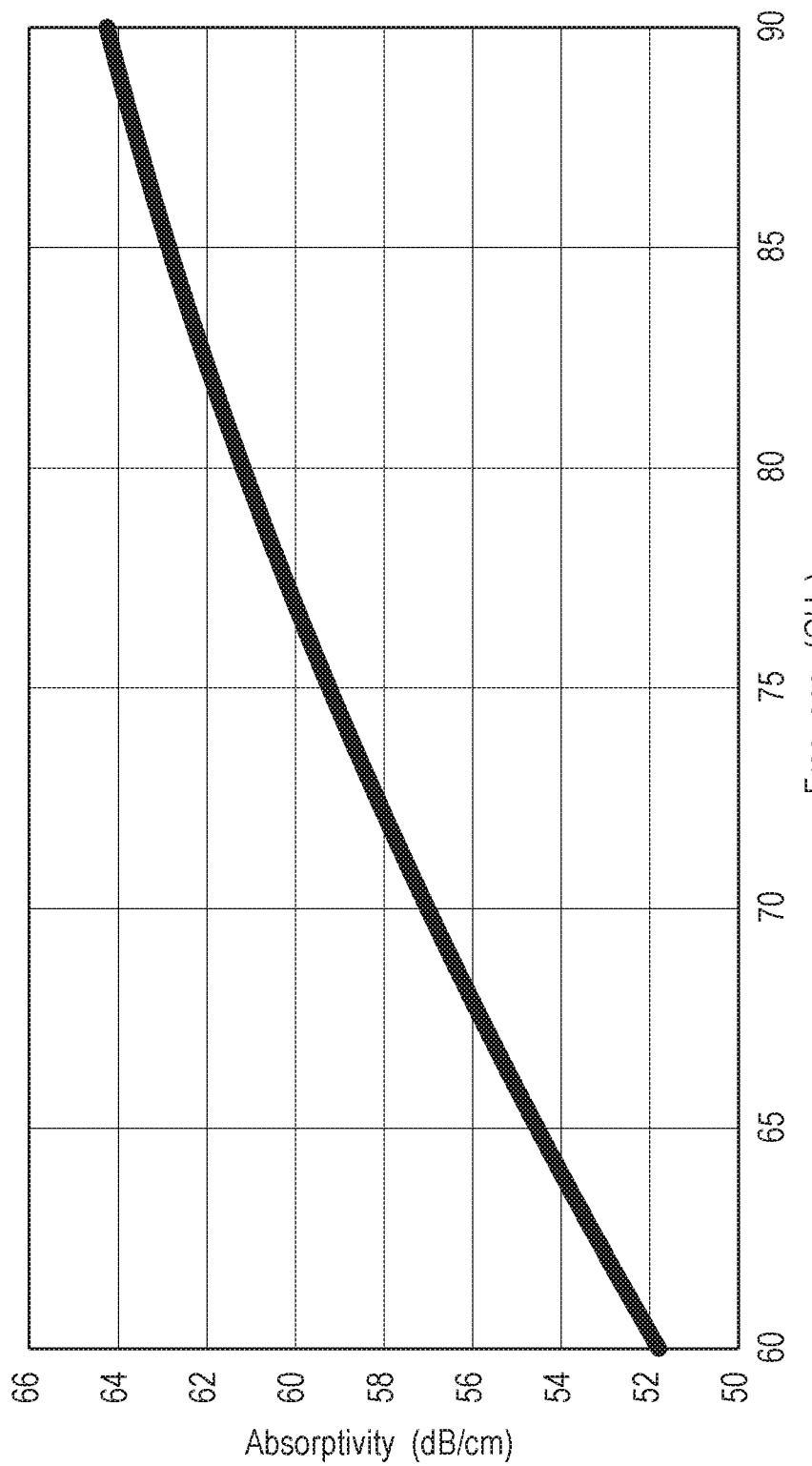
FIG. 17 is a plot of electromagnetic absorptivity versus frequency.

FIG. 17 is a plot of the electromagnetic absorptivity for Example 1 for the frequency range of 60 to 90 GHz calculated from the complex permittivity of the sample.

Modeling Examples M1-M3

Electromagnetic simulations were carried out to determine scattering parameters S11 and S21 and absorption for a layer of a thermally conductive electromagnetically absorptive material similar to that of Example 1 without an anti-reflection film (Modeling Example M1), for the layer with a non-electromagnetically absorbing anti-reflection film facing the emitter (Modeling Example M2), and for the layer with an electromagnetically absorbing anti-reflection film facing the emitter (Modeling Example M3). A thickness (h) range of 0.5 mm to 1.3 mm for the layer of thermally conductive electromagnetically absorptive material was considered. The anti-reflection film included a first layer (e.g., corresponding to layer 221 illustrated in FIG. 8B) and a second layer (e.g., corresponding to layer 222 illustrated in FIG. 8B) where the layers were modeled as quarter wave (QW) layers. The dielectric constants (real relative permittivities) and layer thicknesses are summarized in the following table.

|  | 1$^{st}$ QW layer (layer 221) | 2$^{nd}$ QW layer (layer 222) | EM absorber (layer 250) |
| --- | --- | --- | --- |
| Dielectric constant | 1.697 | 4.89 | 8.3 |
| Layer thickness (mm) | 0.748 | 0.44 | 0.5 to 1.3 |

The thermally conductive electromagnetically absorptive material was modeled as having a loss tangent of 0.35 and for Modeling Example M3, the first and second QW layers were modeled as having loss tangents of 0.15 and 0.25, respectively.

Figure 18A:
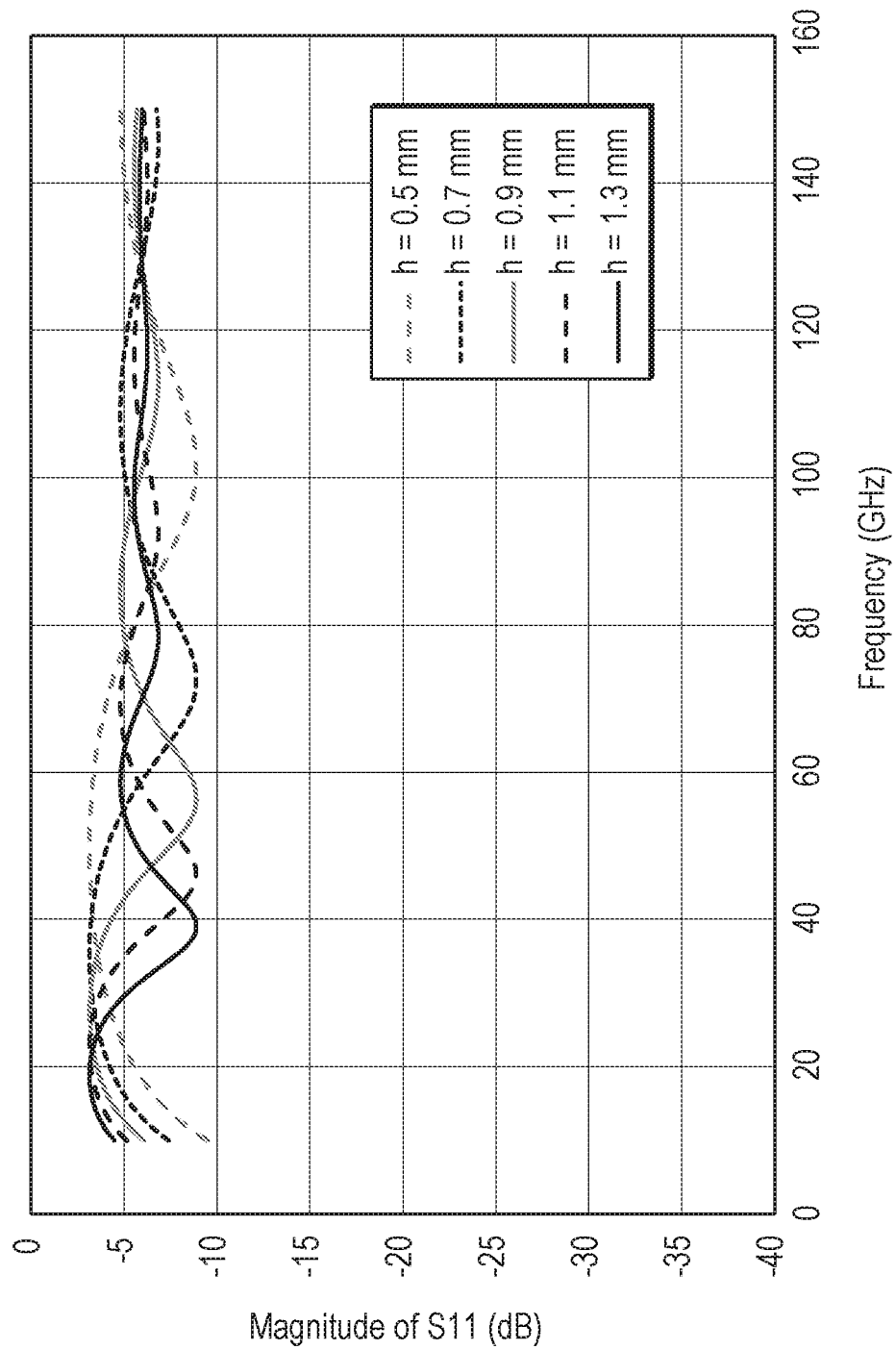
FIGS. 18A-18C are plots of the S11 parameter versus frequency for modeled examples.
Figure 18B:
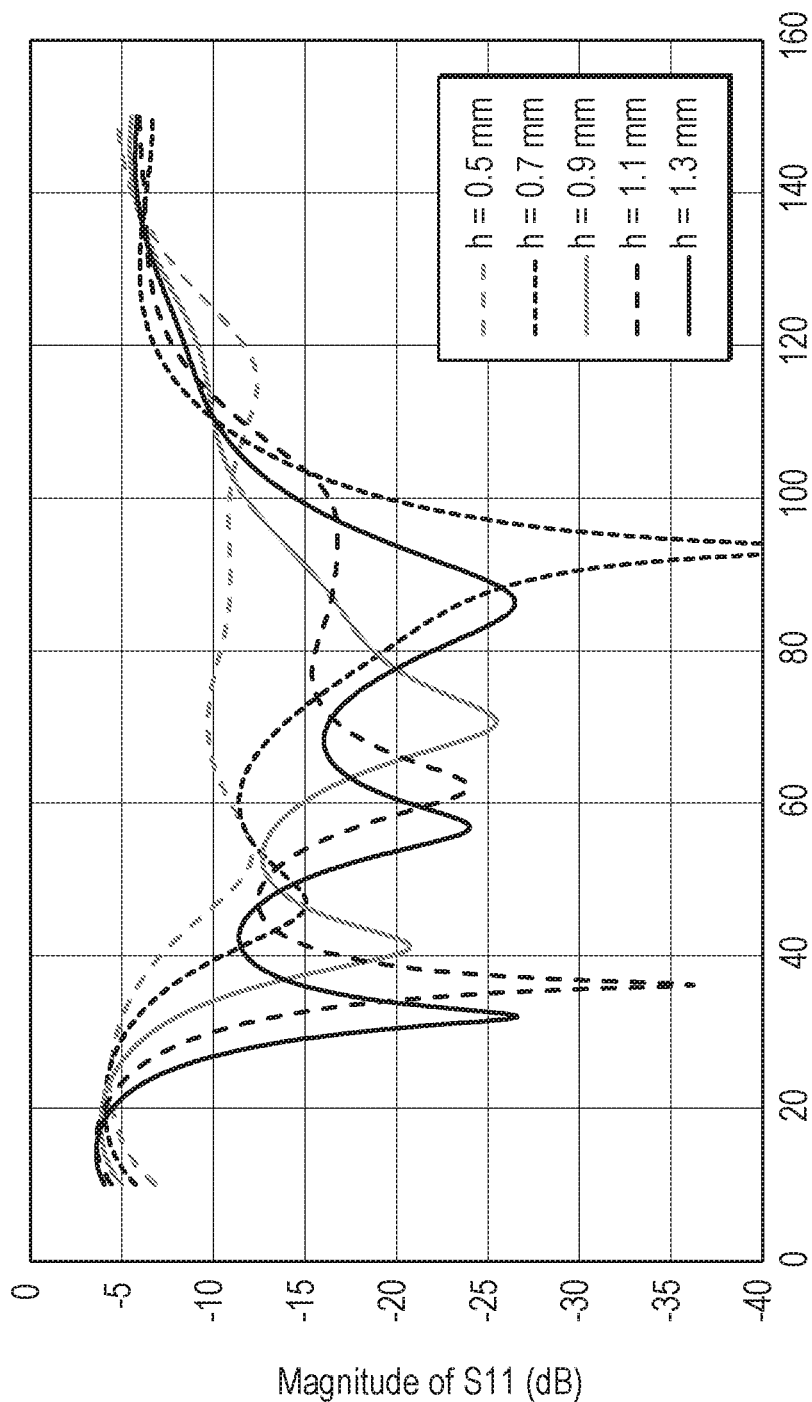
Figure 18C:
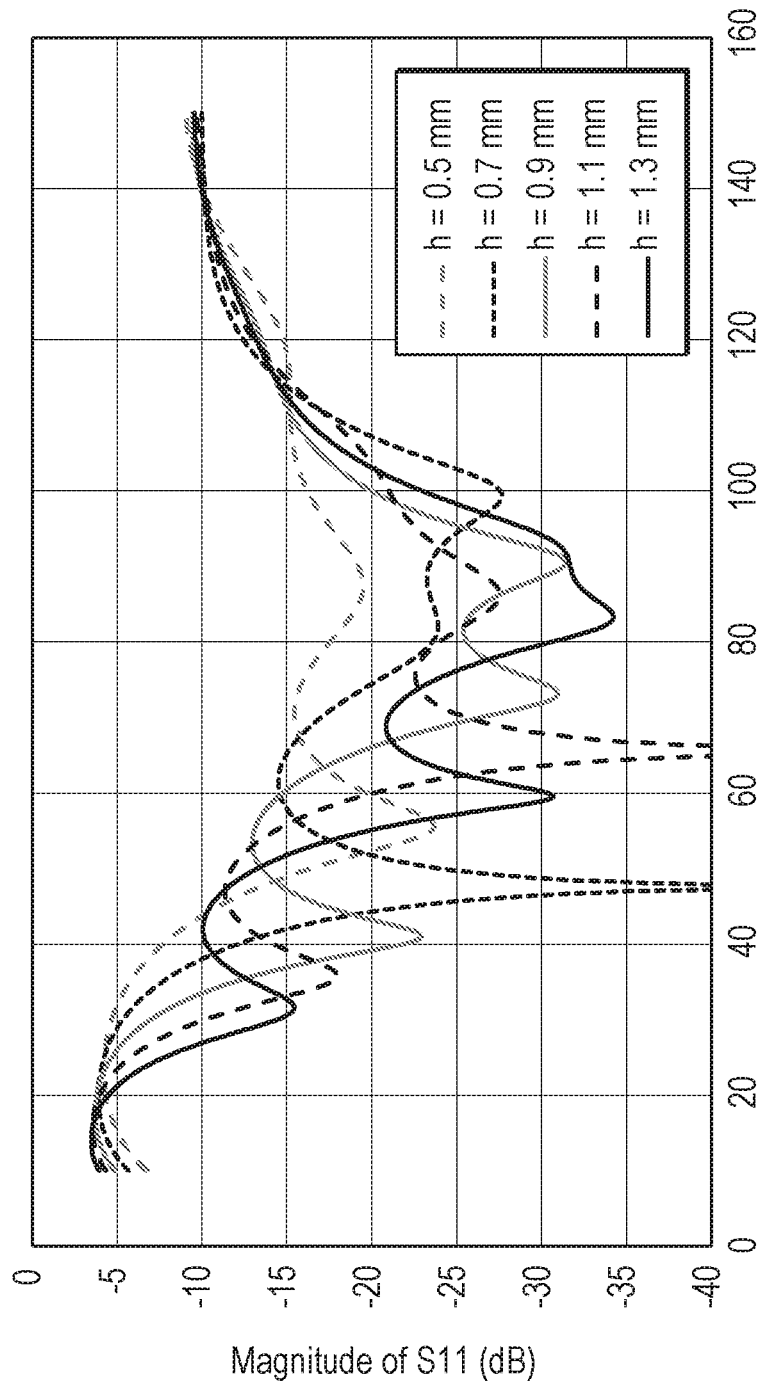
Figure 19A:
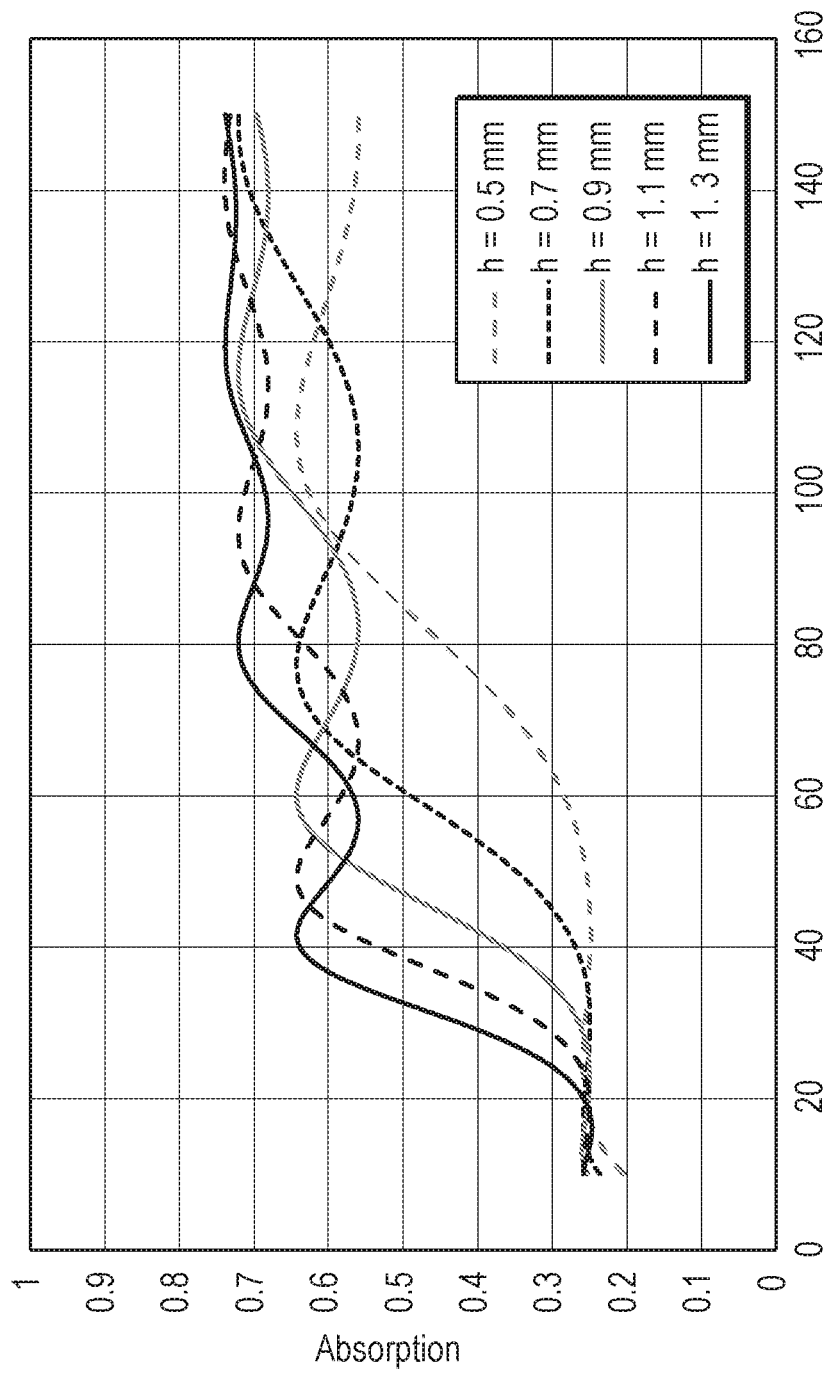
FIGS. 19A-19C are plots of electromagnetic absorption versus frequency for modeled examples.
Figure 19B:
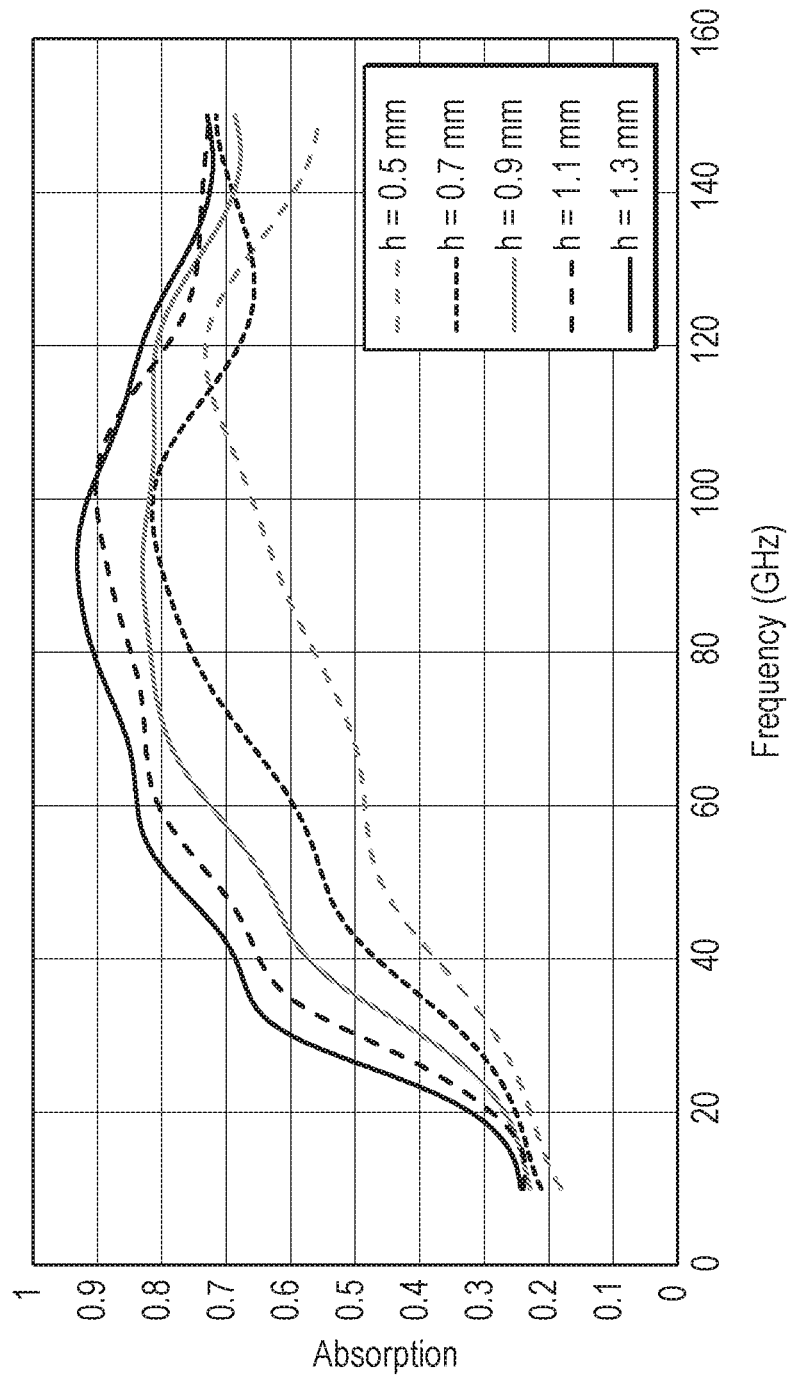
Figure 19C:
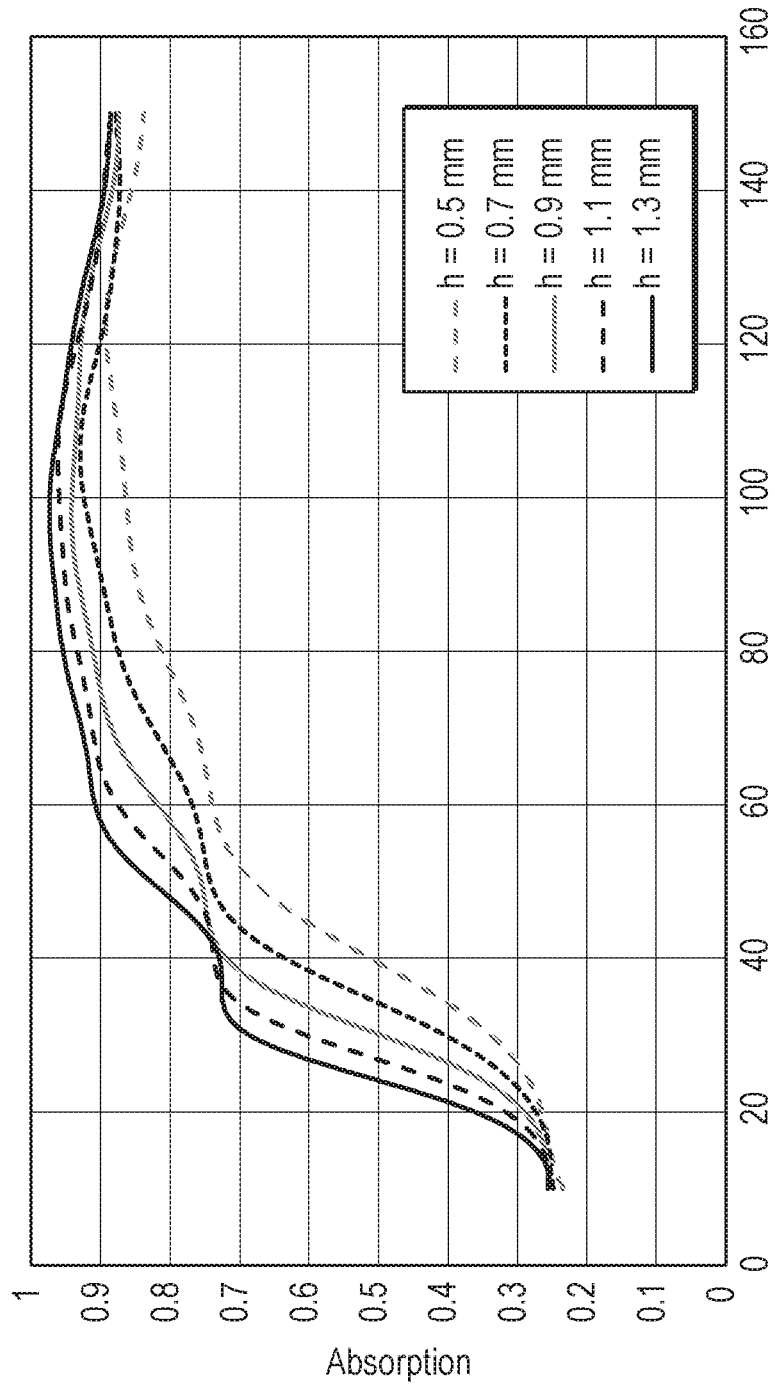

The calculated S11 (reflection) parameter for Modeling Examples M1-M3 are shown in FIGS. 18A-18C, respectively, for a frequency range of about 10 to about 150 GHz. The calculated electromagnetic absorption for Modeling Examples M1-M3 are shown in FIGS. 19A-19C, respectively, for a frequency range of about 10 to about 150 GHz.

Terms such as "about" will be understood in the context in which they are used and described in the present description by one of ordinary skill in the art. If the use of "about" as applied to quantities expressing feature sizes, amounts, and physical properties is not otherwise clear to one of ordinary skill in the art in the context in which it is used and described in the present description, "about" will be understood to mean within 10 percent of the specified value. A quantity given as about a specified value can be precisely the specified value. For example, if it is not otherwise clear to one of ordinary skill in the art in the context in which it is used and described in the present description, a quantity having a value of about 1, means that the quantity has a value between 0.9 and 1.1, and that the value could be 1.

All references, patents, and patent applications referenced in the foregoing are hereby incorporated herein by reference in their entirety in a consistent manner. In the event of inconsistencies or contradictions between portions of the incorporated references and this application, the information in the preceding description shall control.

Descriptions for elements in figures should be understood to apply equally to corresponding elements in other figures, unless indicated otherwise. Although specific embodiments have been illustrated and described herein, it will be appreciated by those of ordinary skill in the art that a variety of alternate and/or equivalent implementations can be substituted for the specific embodiments shown and described without departing from the scope of the present disclosure. This application is intended to cover any adaptations, or variations, or combinations of the specific embodiments discussed herein. Therefore, it is intended that this disclosure be limited only by the claims and the equivalents thereof.

What is claimed is:

1. A thermally conductive electromagnetically absorbing material comprising a plurality of particles dispersed in a binder, the plurality of particles comprising all particles dispersed in the binder for increasing electromagnetic absorption or thermal conductivity of the material, the plurality of particles consisting of a plurality of first particles having a first Dv50 size a1 and a plurality of second particles having a second Dv50 size a2, a1/a2≥1.5, the first particles comprising at most 1% of a total number of the first and second particles and being more electromagnetically absorbing than the second particles, such that the material has a thermal conductivity of at least 2 W/(m-K) along at least one direction, and for an at least one frequency in a frequency range from about 20 GHz to about 120 GHz, the material:

has a relative real permittivity of less than about 10; and
attenuates a substantially normally incident radiation having the at least one frequency by at least 5 dB/mm.

2. The thermally conductive electromagnetically absorbing material of claim 1, wherein the plurality of first particles has a particle size distribution comprising a peak at a particle size d1, the plurality of second particles has a particle size distribution comprising peaks at particle sizes S1 and S2, and d1>S1 and S2.

3. The thermally conductive electromagnetically absorbing material of claim 1, wherein for the at least one frequency, the material has a loss tangent of at least 0.1.

4. An article comprising an anti-reflection film for at least one frequency in a range of about 20 GHz to about 120 GHz disposed on a layer comprising the thermally conductive electromagnetically absorbing material of claim 1.

5. A fifth generation (5G) wireless communication system comprising an antenna comprising an array of distinct spaced apart antenna elements configured to at least one of receive and transmit a signal having a frequency of between about 20 GHz and about 120 GHz; and the thermally conductive electromagnetically absorbing material of claim 1 disposed between at least two antenna elements in the array of antenna elements.

6. The thermally conductive electromagnetically absorbing material of claim 1, wherein the first particles are thermally conductive particles at least partially coated with an electromagnetically absorptive coating and the second particles are thermally conductive and substantially electromagnetically non-absorptive.

* * * * *